United States Patent
Cerio, Jr. et al.

(10) Patent No.: US 8,076,241 B2
(45) Date of Patent: Dec. 13, 2011

(54) METHODS FOR MULTI-STEP COPPER PLATING ON A CONTINUOUS RUTHENIUM FILM IN RECESSED FEATURES

(75) Inventors: Frank M. Cerio, Jr., Albany, NY (US); Shigeru Mizuno, Delmar, NY (US); Jonathan Reid, Sherwood, OR (US); Thomas Ponnuswamy, Sherwood, OR (US)

(73) Assignees: Tokyo Electron Limited, Tokyo (JP); Novellus Systems, Inc., San Jose, CA (US)

( * ) Notice: Subject to any disclaimer, the term of this patent is extended or adjusted under 35 U.S.C. 154(b) by 209 days.

(21) Appl. No.: 12/571,162

(22) Filed: Sep. 30, 2009

(65) Prior Publication Data

US 2011/0076390 A1 Mar. 31, 2011

(51) Int. Cl.
*H01L 21/44* (2006.01)
(52) U.S. Cl. ............... 438/678; 438/687; 257/E21.175; 257/E21.479
(58) Field of Classification Search .............. 438/678, 438/687; 257/E21.175, E21.479
See application file for complete search history.

(56) References Cited

U.S. PATENT DOCUMENTS

| | | | |
|---|---|---|---|
| 5,888,870 | A | 3/1999 | Gardner et al. |
| 6,200,898 | B1 | 3/2001 | Tu |
| 6,730,164 | B2 | 5/2004 | Vaartstra et al. |
| 6,858,546 | B2 | 2/2005 | Niinisto et al. |
| 6,914,312 | B2 | 7/2005 | Nishikawa et al. |
| 7,122,464 | B2 | 10/2006 | Vaartstra |
| 7,270,848 | B2 | 9/2007 | Suzuki et al. |
| 7,279,421 | B2 | 10/2007 | Suzuki |
| 7,312,139 | B2 | 12/2007 | Wang et al. |
| 7,378,129 | B2 | 5/2008 | Kraus et al. |
| 7,425,506 | B1 | 9/2008 | Kailasam |
| 7,446,032 | B2 | 11/2008 | Kailasam |
| 7,456,064 | B2 | 11/2008 | Manchanda et al. |
| 7,456,102 | B1 | 11/2008 | Varadarajan et al. |
| 7,470,617 | B2 * | 12/2008 | Chebiam et al. ............ 438/643 |
| 7,648,908 | B2 * | 1/2010 | Aoi .............................. 438/637 |
| 7,799,684 | B1 | 9/2010 | Reid et al. |
| 7,964,506 | B1 | 6/2011 | Ponnuswamy et al. |

(Continued)

FOREIGN PATENT DOCUMENTS

EP 1548839 6/2005

(Continued)

OTHER PUBLICATIONS

Ponnuswamy, T. et al.., Electrodeposition of Copper on Ruthenium for 22 nm Technology and Beyond, Advanced Metallization Conference, 2007, 12 pp.

(Continued)

*Primary Examiner* — Trung Q Dang
(74) *Attorney, Agent, or Firm* — Wood, Herron & Evans, LLP

(57) ABSTRACT

Methods are provided for multi-step Cu metal plating on a continuous Ru metal film in recessed features found in advanced integrated circuits. The use of a continuous Ru metal film prevents formation of undesirable micro-voids during Cu metal filling of high-aspect-ratio recessed features, such as trenches and vias, and enables formation of large Cu metal grains that include a continuous Cu metal layer plated onto the continuous Ru metal film. The large Cu grains lower the electrical resistivity of the Cu filled recessed features and increase the reliability of the integrated circuit.

30 Claims, 12 Drawing Sheets

U.S. PATENT DOCUMENTS

| | | |
|---|---|---|
| 2002/0135030 A1 | 9/2002 | Horikawa |
| 2003/0045080 A1 | 3/2003 | Visokay et al. |
| 2003/0060003 A1 | 3/2003 | Hecht et al. |
| 2003/0072882 A1 | 4/2003 | Niinisto et al. |
| 2003/0168697 A1 | 9/2003 | Tamura et al. |
| 2004/0051126 A1 | 3/2004 | Cuchiaro et al. |
| 2004/0123803 A1 | 7/2004 | Strang |
| 2004/0129969 A1 | 7/2004 | Colombo et al. |
| 2004/0132315 A1 | 7/2004 | Chambers et al. |
| 2004/0191997 A1 | 9/2004 | Kawahara et al. |
| 2005/0064207 A1 | 3/2005 | Senzaki et al. |
| 2005/0104112 A1 | 5/2005 | Haukka et al. |
| 2005/0130442 A1 | 6/2005 | Visokay et al. |
| 2005/0136632 A1 | 6/2005 | Rotondaro et al. |
| 2005/0233156 A1 | 10/2005 | Senzaki et al. |
| 2005/0272196 A1 | 12/2005 | Wickramanayaka et al. |
| 2006/0054943 A1 | 3/2006 | Li et al. |
| 2006/0072281 A1 | 4/2006 | Nam et al. |
| 2006/0128092 A1 | 6/2006 | Rouse |
| 2006/0151823 A1 | 7/2006 | Govindarajan |
| 2006/0189154 A1 | 8/2006 | Ahn et al. |
| 2007/0004224 A1 | 1/2007 | Currie |
| 2007/0077750 A1 | 4/2007 | Ma et al. |
| 2008/0242088 A1* | 10/2008 | Suzuki .................. 438/687 |
| 2008/0296768 A1 | 12/2008 | Chebiam et al. |
| 2008/0299772 A1 | 12/2008 | Yoon et al. |
| 2009/0226611 A1* | 9/2009 | Suzuki et al. .................. 427/250 |
| 2010/0285660 A1* | 11/2010 | Lin et al. .................. 438/650 |

FOREIGN PATENT DOCUMENTS

| | | |
|---|---|---|
| JP | 05024931 | 2/1993 |
| JP | 11168096 | 6/1999 |
| KR | 2006012926 | 2/2006 |
| WO | 2004053997 | 6/2004 |
| WO | 2005065402 | 7/2005 |

OTHER PUBLICATIONS

C. Yang et al., Physical, electrical, and reliability characterization of Ru for Cu interconnects, IEEE International Interconnect Technology Conf., San Diego, CA, Oct. 17-19, 2006, pp. 187-189.

K. Suzuki et al., Thin CVD Ru film performances as Cu diffusion barrier and for direct plating, Proceedings of the Advanced Metallization Conf., Colorado Springs, CO, Sep. 27-29, 2005, pp. 117-118.

Soon-Cheon Seo et al., Copper Contact metallization for 22nm and beyond, IEEE International Interconnect Technology Conf., Sapporo, Hokkaido ("the island"), Japan, Jun. 1-3, 2009, pp. 8-10.

T. Ponnuswamy et al., Reliability of Cu/Ru/TaN Interconnects, Proceedings of the Advanced Metallization Conf., Del Mar, CA., Sep. 23-25, 2008, pp. 15-16.

T. Ponnuswamy et al., Electrodeposition of copper on ruthenium for 32nm technology and beyond, Proceedings of the Advanced Metallization Conf., Oct. 9-11, 2007, pp. 17-18.

F. Gstrein et al., Ruthenium-based copper metallizaton for the 22nm technology node, Proceedings of the Advanced Metallization Conf., Albany, NY, Oct. 9-11, 2007, pp. 19-20.

Myllymaki et al., High-permittivity YSc03 Thin Films by Atomic Layer Deposition Using Two Precursor Approaches, J. Mater. Chem. R Soc. Chem, UK, vol. 16, No. 6, Feb. 14, 2006, pp. 563-569.

Ohmi et al., Electrical Characteristics of Rare-Earth Oxides Stacked-layer Structures, Gate Insulator, IWGI, Nov. 6, 2003, pp. 28-31.

Nakagawa et al., Magnetocaloric effects of binary rare earth mononitrides, GdxTb1-xN and TbxHo1-xN; Journal of Alloys and Compounds, Feb. 9, 2006, pp. 187-190, vol. 408-412, Elsevier, Sequoia, Lausanne, Switzerland.

S.A. Shelvin et al, Ab initio design of high-k dielectric: LaxY1O3; Abstract, Physical Review Letters APS USA, vol. 94, No. 14, Apr. 13, 2005, 1 pg.

Schlom, Darrel G. et al., Gate Oxides Beyond SiO2, MRS Bulletin, vol. 33, Nov. 2008, www.mrs.org/bulletin, pp. 1017-1025.

Kim et al., Highly Conductive HfNx Films Prepared by Plasma-assisted Atomic Layer Deposition, Electromechanical and Solid-State Letters, 9 (8) C123-C125 (2006).

Xu et al., A Chemical Mechanism for Nitrogen Incorporation into HfO2 ALD Films Using Ammonia and Alkylamide As Precursors, Surface Science 591 (2005) L280-L285.

Xu et al., Atomic Layer Deposition of Hafnium Nitrides Using Ammonia and Alkylamide Precursors, Chemical Physics Letters 407 (2005) 272-275.

Becker et al., Atomic Layer Deposition of Insulating Hafnium and Zirconium Nitrides, Chem. Mater. 2004, 16, 3497-3501.

Niinisto et al., Advanced Electronic and Optoelectronic Materials by Atomic Layer Deposition: an Overview with Special Emphasis on Recent Progress in Processing of High-k Dielectrics and Other Oxide Materials, Phys. Stat. Sol. (A) 201, No. 7, 1443-1452 (2004).

Pending U.S. Appl. No. 12/785,205 filed May 21, 2010, 54 pp.

* cited by examiner

METHODS FOR MULTI-STEP COPPER PLATING ON A CONTINUOUS RUTHENIUM FILM IN RECESSED FEATURES

FIELD OF THE INVENTION

The invention relates to the field of metal plating in integrated circuit fabrication, and more particularly to processing methods for depositing and using ruthenium (Ru) films for plating recessed features with copper (Cu) metal.

BACKGROUND OF THE INVENTION

An integrated circuit (IC) contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect structure. Metal layers typically occupy etched pathways in the interlayer dielectric. A "via" normally refers to any recessed feature, such as a hole, line or other similar feature, formed within a dielectric layer that provides an electrical connection through the dielectric layer to a conductive layer underlying the dielectric layer. Similarly, recessed features containing metal layers connecting two or more vias are normally referred to as trenches.

A long-recognized objective in the constant advancement of IC technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. For example, the recessed features are becoming so small that micro-voids in bulk metal filling of the recessed features are unacceptable. As the width of metal lines is scaled down to smaller submicron and even nanometer dimensions, electromigration failure, which may lead to open and extruded metal lines, is now a well-recognized problem. Moreover, as dimensions of metal lines further decrease, metal line resistivity increases substantially, and this increase in line resistivity may adversely affect circuit performance.

The introduction of Cu metal into multilayer metallization schemes for manufacturing integrated circuits is enabled by the damascene Cu plating process and is now extensively used by manufacturers of advanced microprocessors and application-specific circuits. However, Cu metal cannot be put in direct contact with dielectric materials since Cu metal has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the integrated circuits to surround the Cu metal and prevent diffusion of the Cu into the integrated circuit materials.

A thin film of Ru deposited on a wafer substrate is useful for Cu plating in integrated circuit fabrication. In the past, deposition of Ru on dielectric materials or on diffusion barrier materials has been problematic. The deposition of a thin Ru film by chemical vapor deposition (CVD) or atomic layer deposition (ALD) often resulted in poor morphology of the thin Ru film. The plating of Cu directly onto a thin Ru film has also been problematic in the past. Cu that is plated directly onto a conventional thin Ru film often shows poor adhesion to the thin Ru film, likely due to impurities in the thin Ru film, discontinuous growth of the thin Ru film, and/or the poor morphology/surface roughness of the thin Ru film. As a result, plated Cu deposits unevenly on the substrate and void-free filling of high aspect ratio features is problematic. Furthermore, conventional post Cu plating annealing processes that are performed to attempt to grow large Cu grains in the entire Cu material, and thereby reduce the electrical resistance of the Cu material, are especially problematic for narrow (<100 nm, nm=$10^{-9}$ m) and high-aspect-ratio recessed features. As the features get smaller the more difficult it is to fill them with large grain Cu. Furthermore, since scaling of future semiconductor devices will continue to ever smaller minimum feature sizes, widths of recessed features will continue to decrease and depths will continue to increase.

There exists a need for depositing high-purity continuous Ru films with low surface roughness that can be integrated with Cu plating of narrow and high-aspect-ratio recessed features to solve the above problems.

SUMMARY OF THE INVENTION

Methods are provided for multi-step Cu metal plating on a continuous Ru metal film in recessed features found in advanced integrated circuits. The use of a high-purity continuous Ru metal film prevents formation of undesirable micro-voids during Cu metal filling of high-aspect-ratio recessed features, such as trenches and vias, and enables formation of large Cu metal grains that include a continuous Cu metal layer (Cu seed layer) plated onto the continuous Ru metal film. The large Cu grains lower the electrical resistivity of the Cu filled recessed features and increase the reliability of the integrated circuit.

According to one embodiment of the invention, the method includes providing a substrate having at least one recessed feature formed on a surface thereof; depositing a continuous Ru metal film in the recessed feature by thermal chemical vapor deposition (TCVD) using a process gas containing a $Ru_3(CO)_{12}$ precursor; and contacting the continuous Ru metal film with a Cu plating bath to allow deposition of a continuous Cu metal layer on the continuous Ru metal film, wherein the continuous Cu metal layer and continuous Ru metal film together fill less than 100% of the width, depth and volume of the recessed feature. The method further includes removing the substrate from the Cu plating bath; annealing the continuous Cu metal layer in a non-oxidizing gas; and repeating the contacting, removing, and annealing to form an at least partial Cu fill in the recessed feature that comprises large Cu metal grains on the continuous Ru metal film formed from the annealed continuous Cu metal layer and the annealed additional Cu metal. The depositing may include depositing a substantially oxygen-and carbon-free continuous Ru film by TCVD using a carbon monoxide (CO) carrier gas.

According to another embodiment of the invention, the method includes providing a substrate having at least one recessed feature formed on a surface thereof; depositing a substantially oxygen-and carbon-free continuous Ru metal film in the recessed feature by TCVD using a process gas containing a $Ru_3(CO)_{12}$ precursor and CO carrier gas, contacting the continuous Ru metal film with a first Cu plating bath to allow deposition of a continuous Cu metal layer on the continuous Ru metal film; removing the substrate from the first Cu plating bath; and annealing the continuous Cu metal layer in a non-oxidizing gas. The continuous Cu metal layer and continuous Ru metal film together fill the recessed feature to a first width, depth and volume that is less than 100% of the width, depth and volume of the recessed feature. The method further includes contacting the annealed continuous Cu metal layer with a second Cu plating bath to allow deposition of additional Cu metal that at least partially fills the recessed feature; removing the substrate from the second Cu plating bath; and annealing the additional Cu metal under non-oxidizing conditions. In this embodiment, the second Cu plating bath has a different chemical composition than the first Cu plating bath whereby the additional Cu metal layer deposits at a faster rate than the continuous Cu metal layer, and the additional Cu metal layer further fills the recessed feature to a second width, depth and volume that is greater than the first width, depth and volume and less than or equal to 100% of the width, depth and volume of the recessed feature, and the method forms large Cu metal grains on the continuous Ru metal film from the annealed continuous Cu metal layer and additional Cu metal.

According to yet another embodiment of the invention, a method is provided for filling damascene features in a partially fabricated integrated circuit. The method includes depositing a substantially oxygen-and carbon-free continuous Ru metal film on a diffusion barrier in at least one recessed feature of the partially fabricated integrated circuit by TCVD using a process gas containing a $Ru_3(CO)_{12}$ precursor and CO carrier gas; and annealing the continuous Ru metal film in a non-oxidizing gas containing an inert gas or hydrogen ($H_2$) gas, or a combination thereof, at a substrate temperature in a range from about 100° C. to about 500° C. The method further includes immersing the partially fabricated integrated circuit, or at least a portion thereof, in a first Cu plating bath to allow deposition of a continuous Cu metal layer on the continuous Ru metal film; removing the partially fabricated integrated circuit from the first Cu plating bath; and annealing the continuous Cu metal layer in a non-oxidizing gas containing an inert gas or $H_2$ gas, or a combination thereof, at a substrate temperature in a range from about 100° C. to about 500° C. The continuous Cu metal layer and continuous Ru metal film together fill the recessed feature to a first width, depth and volume that is less than 100% of the width, depth and volume of the recessed feature. The method further includes re-immersing the partially fabricated integrated circuit, or at least a portion thereof, in a second Cu plating bath to allow deposition of additional Cu metal that at least partially fills the recessed features to a second width, depth and volume greater than the first and less than or equal to the width, depth and volume of the recessed feature; removing the partially fabricated integrated circuit from the second Cu plating bath; and annealing the additional Cu metal in a non-oxidizing gas containing an inert gas, $H_2$ gas, or a combination thereof, at a substrate temperature in a range from about 100° C. to about 500° C., whereby large Cu metal grains are formed on the continuous Ru metal film from the annealed continuous Cu metal layer and the annealed additional Cu metal.

DETAILED DESCRIPTION OF SEVERAL EMBODIMENTS OF THE INVENTION

Methods for Cu metal plating on a continuous Ru metal film in recessed features found in advanced integrated circuits are disclosed in several embodiments. The use of a continuous Ru metal film eliminates or at least substantially reduces formation of undesirable micro-voids during Cu metal filling of high-aspect-ratio recessed features, such as trenches and vias. The continuous Ru metal film provides superior continuous adhesion to a thin continuous Cu metal layer plated on the continuous Ru metal film in the recessed features. The continuous adhesion unexpectedly allows for enhanced Cu grain penetration into the recessed feature and the growth of large Cu grains that include the entire Cu metal in the recessed features, including the continuous Cu metal layer. The large Cu grains lower the electrical resistivity of the Cu filled recessed features and increase the reliability of the integrated circuit.

Embodiments of the invention are described herein with reference to FIGS. 1-8. It should be understood that FIGS. 1 and 2 depicting recessed features found in integrated circuit devices, are not meant to be actual plan or cross-sectional views of any particular portion of an actual integrated circuit device. In the actual devices, the films and layers may not be as regular and the thicknesses may have different proportions. The figures instead show idealized representations, which are employed to explain more clearly and fully the embodiments of the invention than would otherwise be possible.

Also, the figures represent only one of innumerable variations of devices that could be fabricated using the embodiments of the invention. Processes are described in the specification with reference to FIGS. 1-8; nevertheless, it is clear that methods in accordance with embodiments of the invention can be practiced using structures, systems and fabrication processes very different from those described in detail herein. The embodiments described herein are exemplary and are not intended to limit the scope of the invention, which is defined in the claims below.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Figure 1A:
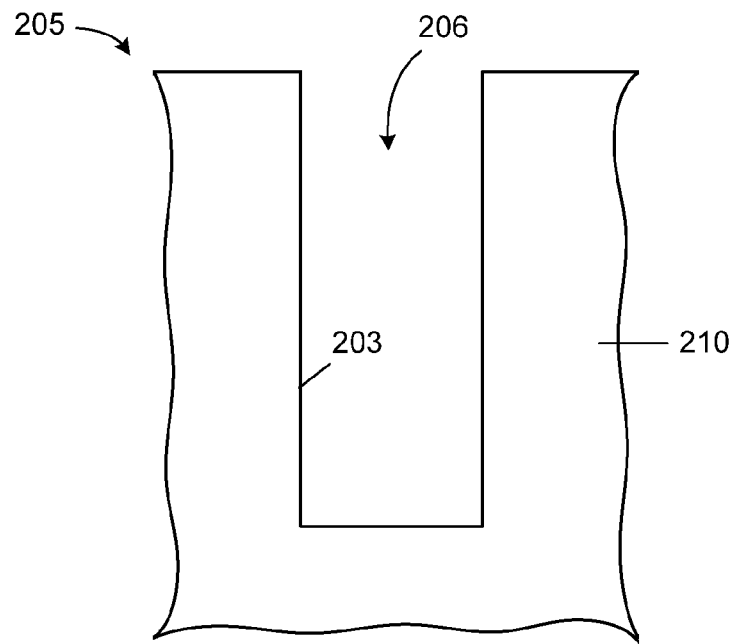
FIGS. 1A-1L schematically show cross-sectional views of a process for Cu plating on a continuous Ru film in a recessed feature according to embodiments of the invention.

FIG. 1A depicts schematically a simplified recessed feature, as is known in the art.

FIGS. 1B-1L schematically show cross-sectional views of a process for Cu plating on a continuous Ru film in a recessed feature according to embodiments of the invention.

FIG. 1A depicts schematically a cross-sectional view of a portion 205 of an integrated circuit in an intermediate phase of fabrication. The portion 205 shows a layer 210 containing a recessed feature 206 with a surface 203. The layer 210 can, for example, contain a Si substrate or a dielectric layer. A dielectric layer 210 can, for example, contain $SiO_2$, a low dielectric constant (low-k) dielectric material such as fluorinated silicon glass (FSG), carbon doped silicon oxide (e.g., CORAL™), carbon-doped silicon nitride, a SiCOH or SiCOH-containing low-k material, a non-porous low-k material, a porous low-k material, a CVD low-k material, a spin-on dielectric (SOD) low-k material, or any other suitable dielectric material. Dielectric layer 210 also may include a non-silicon-containing low-k dielectric material instead of or in addition to a silicon-containing dielectric material; for example, a commercially available polymer-based carbon-hydrogen-oxygen-containing dielectric material, such as SILK™.

Figure 2A:
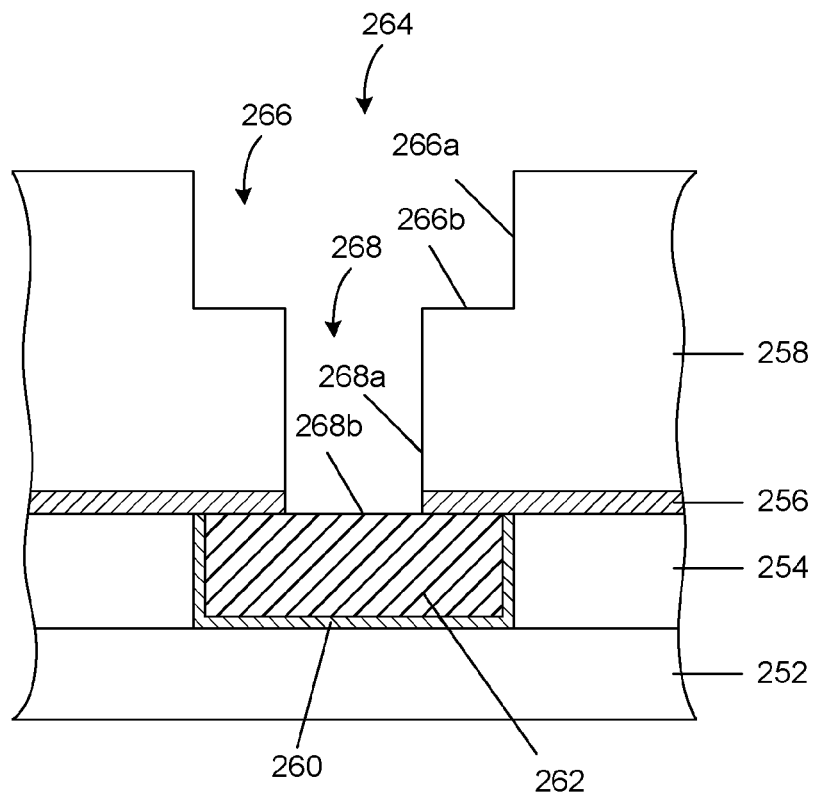
FIGS. 2A and 2B schematically show cross-sectional views of additional recessed features according to embodiments of the invention.
Figure 2B:
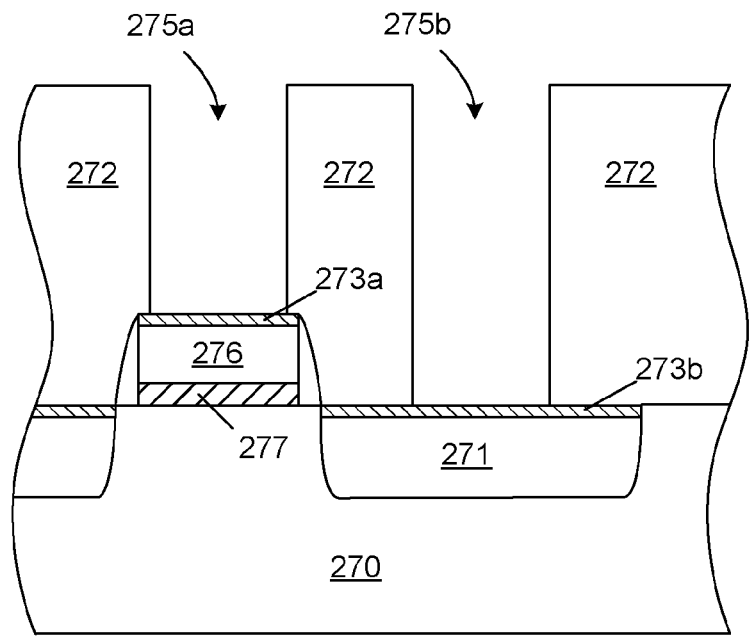

The recessed feature 206 can, for example, be a trench or a via having an aspect ratio greater than or equal to about 2:1, for example 3:1, 4:1, 5:1, 6:1, 12:1, 15:1, or higher. The trench/via can have a width of about 200 nm or less, for example 150 nm, 100 nm, 65 nm, 45 nm, 32 nm, 22 nm, or less. However, embodiments of the invention are not limited to these aspect ratios or trench/via widths, as other aspect ratios and trench/via widths may be utilized. Although only one recessed feature 206 is depicted in FIG. 1A for clarity, those skilled in the art will readily realize that conventional integrated circuits contain a large number of recessed features and embodiments of the invention may readily be applied to integrated circuits containing any number of recessed features. Additional examples of recessed features are shown in FIGS. 2A and 2B.

Figure 1B:
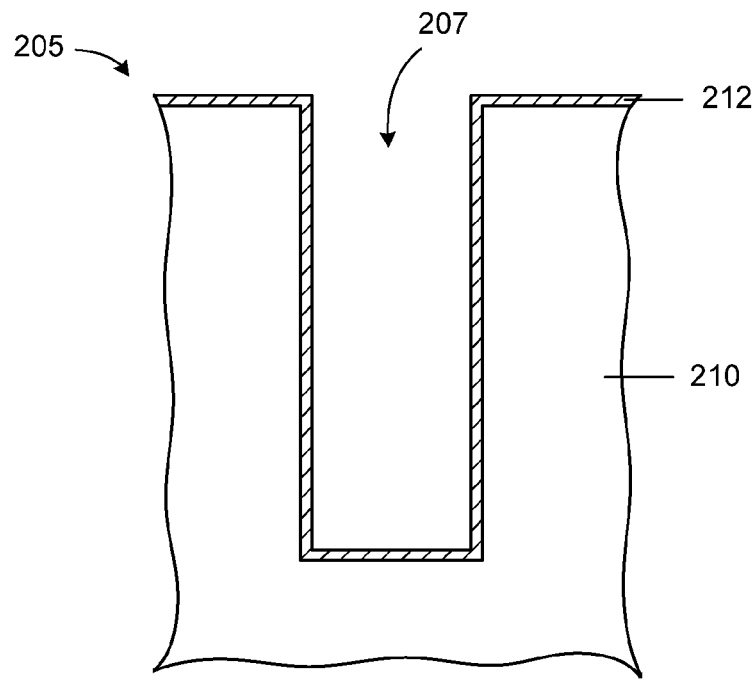

FIG. 1B shows a recessed feature 207 containing a diffusion barrier film 212 formed in the recessed feature 206 of FIG. 1A. The diffusion barrier film 212 can, for example, contain a tantalum (Ta)-containing film (e.g., tantalum (Ta), tantalum nitride (TaN), tantalum carbide (TaC), or tantalum carbonitride (TaCN), a titanium (Ti)-containing film (e.g., titanium (Ti), titanium nitride (TiN), titanium carbide (TiC), or titanium carbonitride (TiCN), or a tungsten (W)-containing film (e.g., tungsten (W), tungsten nitride (WN), tungsten carbide (WC), or tungsten carbonitride (WCN), or a combination thereof. The combination may include two or more separate Ta, TaN, Ti, TiN, and WN films, for example Ta/TaN, Ti/TiN, TaN/TiN, or TaN/WN. A thickness of the diffusion barrier film 212 can, for example, be between about 1 nm and about 10 nm, or between about 2 nm and about 5 nm, for example about 4 nm. The diffusion barrier film 212 may be deposited in a film deposition system by a variety of different deposition methods known by one of ordinary skill in the art, including, but not limited to, PVD, ionized PVD (iPVD), TCVD, pulsed CVD, plasma-enhanced CVD (PECVD), ALD, plasma-enhanced ALD (PEALD), or sputtering methods. In one example, the diffusion barrier film 212 may be conformally formed in the high-aspect-ratio recessed feature 207.

A wide variety of Ta-, Ti-, and W-containing precursors may be utilized for depositing the diffusion barrier film 212. Representative examples of Ta-containing precursors include $Ta(NMe_2)_5$ (pentakis(dimethylamido)tantalum, PDMAT), $Ta(NEtMe)_5$ (pentakis(ethylmethylamido)tantalum, PEMAT), ($^tBuN)Ta(NMe_2)_3$ (tert-butylimido tris(dimethylamido)tantalum, TBTDMT), ($^tBuN)Ta(NEt_2)_3$ (tert-butylimido tris(diethylamido)tantalum, TBTDET), ($^tBuN)Ta(NEtMe)_3$ (tert-butylimido tris(ethylmethylamido)tantalum, TBTEMT), $(EtMe_2CN)Ta(NMe_2)_3$ (tert-amylimido tris(dimethylamido)tantalum, TAIMATA), ($^iPrN)Ta(NEt_2)_3$ (iso propylimido tris(diethylamido)tantalum, IPTDET), $Ta_2(OEt)_{10}$ (tantalum penta-ethoxide, TAETO), $(Me_2NCH_2CH_2O)Ta(OEt)_4$ (dimethylaminoethoxy tantalum tetra-ethoxide, TATDMAE), and $TaCl_5$ (tantalum pentachloride). Representative examples of Ti-containing precursors include $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), $Ti(THD)_3$ (tris(2,2,6,6-tetramethyl-3,5-heptanedionato)titanium), and $TiCl_4$ (titanium tetrachloride). Representative examples of W-containing precursors include $W(CO)_6$ (tungsten hexacarbonyl), $WF_6$ (tungsten hexafluoride), and $(^tBuN)_2W(NMe_2)_2$ (bis(tert-butylimido)bis(dimethylamido)tungsten, BTBMW). In the above precursors, the following abbreviations are used: Me: methyl; Et: ethyl; $^iPr$: isopropyl; $^tBu$: tert-butyl; and THD: 2,2,6,6-tetramethyl-3,5-heptanedionate. In some examples, a nitrogen-containing gas, such as ammonia ($NH_3$) or hydrazine ($N_2H_4$), may be utilized as a source of nitrogen when depositing the diffusion barrier film 212. According to some embodiments of the invention, the diffusion barrier film 212 may be omitted.

Figure 1C:
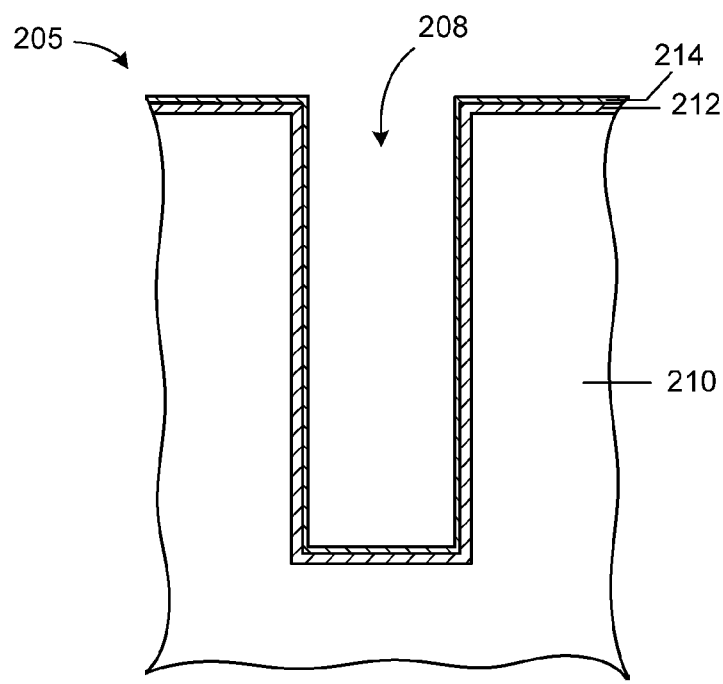

FIG. 1C shows a recessed feature 208 containing a Ru metal film 214 formed on the optional diffusion barrier film 212 of recessed feature 207. A thickness of the Ru metal film 214 can, for example, be in a range from about 0.5 nm to about 10 nm, in a range from about 2 nm to 5 nm, or in a range from about 3 nm to about 4 nm, for example about 2 nm.

The Ru metal film 214 may be deposited in a CVD or TCVD process using a $Ru_3(CO)_{12}$ precursor and a CO carrier gas. The CO carrier gas may be utilized for efficient transfer of $Ru_3(CO)_{12}$ precursor vapor from a metal precursor vaporization system to a process chamber configured for depositing a Ru metal film on a substrate. The use of CO carrier gas enables high $Ru_3(CO)_{12}$ precursor vapor transfer rates required for semiconductor manufacturing by preventing or minimizing premature decomposition of the $Ru_3(CO)_{12}$ precursor in the metal precursor vaporization system and in the gas lines between the metal precursor vaporization system and the Ru metal deposition chamber. Exemplary Ru TCVD processes using a $Ru_3(CO)_{12}$ precursor and a CO carrier gas are described in U.S. Pat. Nos. 7,270,848 and 7,279,421, the entire contents of which are incorporated herein by reference.

Processing conditions for depositing Ru metal film 214 may include a substrate temperature in a range from about 100° C. to about 400° C., or from about 150° C. from about 250° C., and deposition chamber pressure in a range from about 0.1 mTorr to about 200 mTorr, from about 5 mTorr to about 200 mTorr, or from about 50 mTorr to about 150 mTorr.

The solid $Ru_3(CO)_{12}$ precursor being vaporized in the metal precursor vaporization system may be maintained at a temperature in a range from about 40° C. to about 150° C., or between about 60° C. and about 90° C. In one example, the Ru metal deposition conditions may include maintaining the solid $Ru_3(CO)_{12}$ precursor at a temperature of about 80° C. or less, maintaining a deposition chamber pressure of about 100 mTorr, and maintaining a substrate temperature of about 200° C.

The use of a $Ru_3(CO)_{12}$ precursor in a TCVD process enables deposition of substantially oxygen-and carbon-free continuous Ru metal films well suitable for semiconductor manufacturing. In one example, a 2 nm thick Ru metal film was deposited on a TaN film. The Ru metal film had oxygen and carbon impurity levels of about 0.1% as measured by secondary ion mass spectroscopy (SIMS), average Ru metal grain size of about 1.9 nm as measured by X-ray diffraction (XRD), and root mean square (RMS) surface roughness of about 0.63 nm as measured by an atomic force microscope (AFM).

Figure 1D:
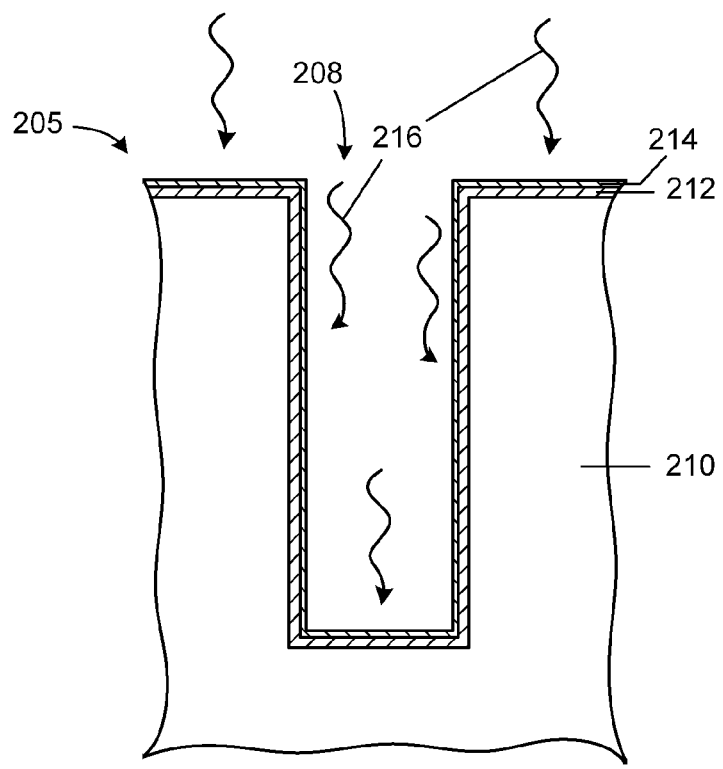

According to some embodiments of the invention, the deposited Ru metal film 214 may optionally be annealed in a non-oxidizing gas that further reduces oxygen and carbon impurities and improves material properties of the Ru metal film 214. In FIG. 1D, arrows 216 represent annealing of Ru metal film 214. The non-oxidizing gas may contain an inert gas, hydrogen ($H_2$) gas, or a combination thereof. In one example, the Ru metal film 214 may be annealed in a $H_2$-containing gas that consists of $H_2$ gas, or consists of a combination of $H_2$ gas and an inert gas. The inert gas may be selected from nitrogen ($N_2$) gas and the noble gases (i.e., He, Ne, Ar, Kr, and Xe). Furthermore, the $H_2$-containing gas may be plasma excited or not plasma excited. Combinations of $H_2$ and an inert gas can, for example, include 90% $H_2$ or less, for example 80%, 60%, 20%, 10%, 5%, or less, and balance inert gas. The $H_2$-containing gas may contain or consist of forming gas. Forming gas usually contains less that about 10% $H_2$, balance $N_2$. Exemplary annealing conditions may further include a gas pressure in a range from about 1 Torr to about 1000 Torr, or in a range from about 10 Torr to about 100 Torr, substrate temperature in a range from about 100° C. to about 500° C., or in a range from about 200° C. to about 400° C., and annealing times in a range from about 1 min to about 30 minutes. However, embodiments of the invention are not limited by these conditions as other annealing conditions may be utilized. In some embodiments of the invention, the gas pressure may be in a range from about 0.1 Torr to about 100 Torr, or in a range from about 0.5 Torr to about 10 Torr. In one example, the 2 nm thick Ru metal film described above was annealed in forming gas for 10 min at 1.5 Torr and 400° C., and this treatment further reduced the oxygen-and carbon-impurity levels to less than 0.1%. In addition, the average Ru metal grain size was increased to 2.4 nm, and the RMS surface roughness was decreased to 0.5 nm.

Figure 1E:
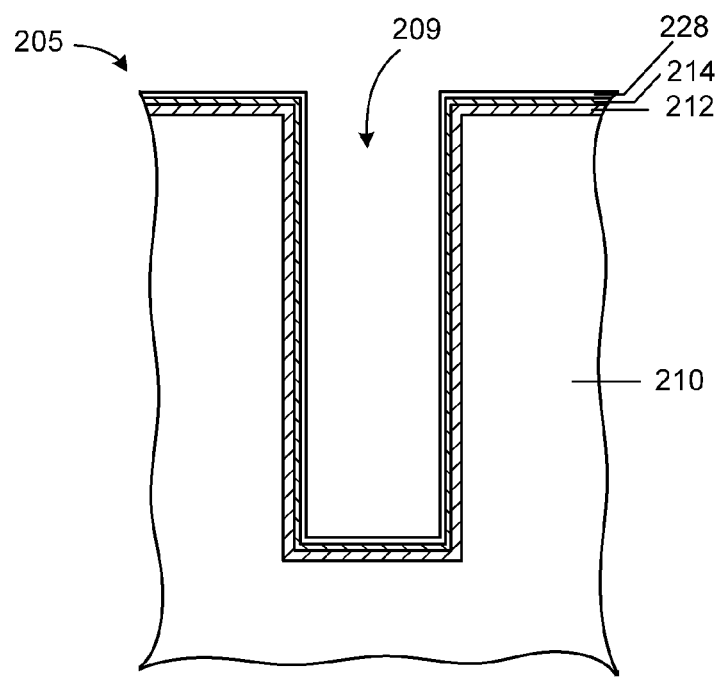

FIG. 1E shows a recessed feature 209 containing a continuous Cu metal layer 228 plated on the continuous Ru metal film 214 of the recessed feature 208 of FIG. 1D or 1C according to embodiments of the invention. The continuous Cu metal layer 228 may be formed by contacting the continuous Ru metal film 214 with a first Cu plating bath in a processing system configured for Cu plating and annealing. The Cu plating process may be an electrochemical Cu plating process or an electroless Cu plating process. The continuous Cu metal layer 228 may have a thickness in a range from about 1 nm to about 50 nm, in a range from about 2 nm to about 20 nm, or in a range from about 2 nm to about 10 nm. In some examples, the continuous Cu metal layer 228 may have a thickness of about 2.5 nm or about 4 nm. According to embodiments of the invention, the continuous Cu metal layer 228 only partially fills the recessed feature 209 with Cu metal as depicted in FIG. 1E. Following formation of the continuous Cu metal layer 228, the portion 205 is removed from the first Cu plating bath.

According to some embodiments of the invention, a thickness of the Ru metal film 214 and/or a thickness of the continuous Cu metal layer 228 may be small compared to a width of the recessed feature 206. This allows for void-free filling of the recessed feature 209 in one or more subsequent Cu plating steps. For example, for a thickness in a range from about 2 nm to about 5 nm for the Ru metal film 214, and a thickness of the continuous Cu metal layer 228 in a range from about 2 nm to about 10 nm, a combined thickness of the Ru metal film 214 and the continuous Cu metal layer 228 is between about 4 nm and about 15 nm. Thus, for a width of 45 nm for the recessed feature 206, the combined Ru metal film 214 and continuous Cu metal layer 228 of recessed feature 209 occupy between about 18% and about 67% of the width of the recessed feature 206. For a thickness in a range from about 2 nm to about 5 nm for the Ru metal film 214, and a thickness of the continuous Cu metal layer 228 in a range from about 2.5 nm to about 4 nm, the combined Ru metal film 214 and continuous Cu metal layer 228 of recessed feature 209 occupy between about 20% and about 40% of the width of the recessed feature 206. Similar calculations may be done for other widths of the recessed feature 206, for example 32 nm and 22 nm widths. According to some embodiments of the invention, the combined Ru metal film 214 and continuous Cu metal layer 228 may occupy less than about 50, less than about 40, less than about 30, or even less than about 20% of the width of the recessed feature 206. Similarly, in terms of the depth and volume of the recessed feature 206, the Ru metal film 214 and continuous Cu metal layer 228 together occupy less than the 100% of the depth and volume of the recessed feature 206, for example, less than about 50, less than about 40, less than about 30, or even less than about 20% of the depth and volume of the recessed feature 206.

Figure 1F:
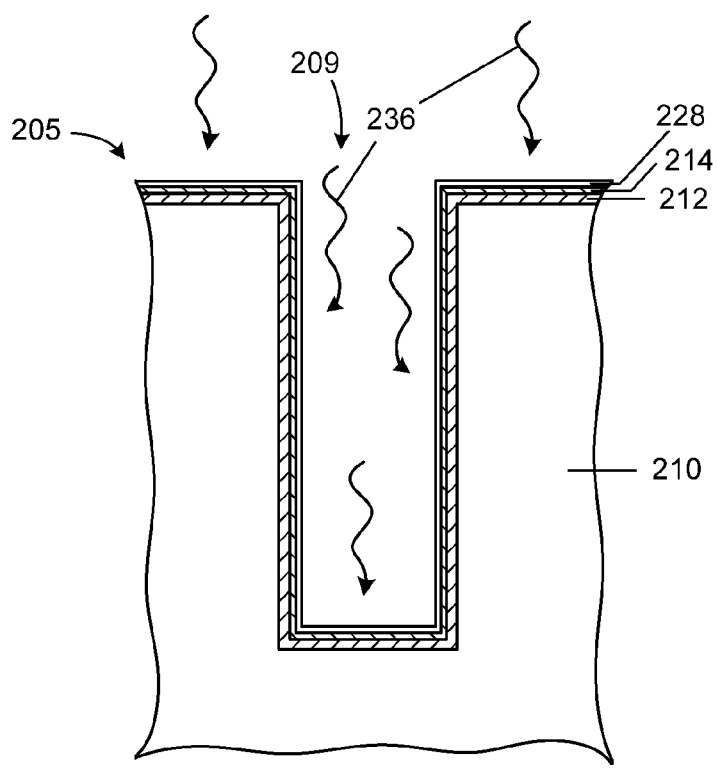
Figure 1G:
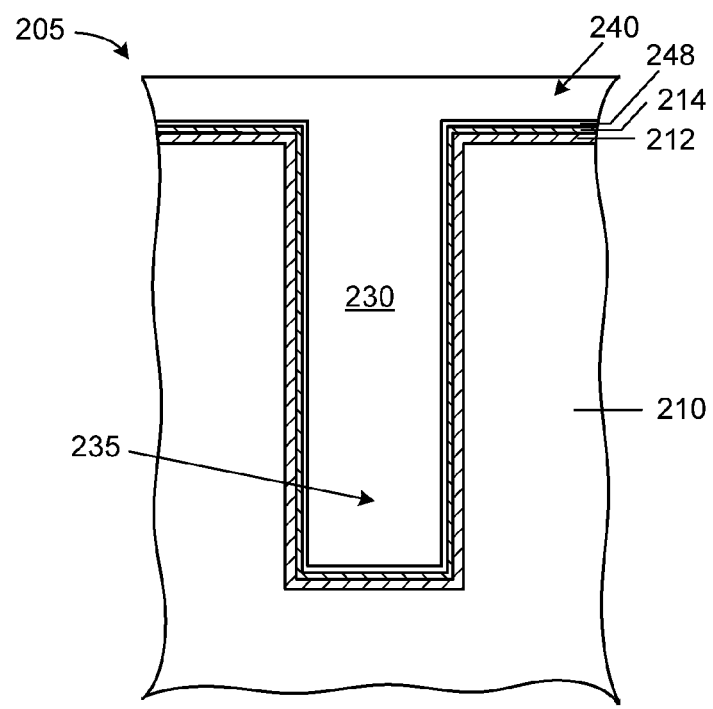

According to embodiments of the invention, following deposition of the continuous Cu metal layer 228, the portion 205 may be annealed in a non-oxidizing gas to improve material properties of the continuous Cu metal layer 228, including reducing impurities and increasing Cu grain size. In FIG. 1F, arrows 236 represent annealing of continuous Cu metal layer 228. In one example, the continuous Cu metal layer 228 may be annealed in a $H_2$-containing gas that consists of $H_2$ gas, or consists of a combination of $H_2$ gas and an inert gas. The inert gas may be selected from $N_2$ gas and the noble gases (i.e., He, Ne, Ar, Kr, and Xe). Furthermore, the $H_2$-containing gas may be plasma excited or not plasma excited. Combinations of $H_2$ and an inert gas can, for example, include 90% $H_2$ or less, for example 80%, 60%, 20%, 10%, 5%, or less, and balance inert gas. The $H_2$-containing gas may contain or consist of forming gas. Forming gas usually contains less that about 10% $H_2$, balance $N_2$. Exemplary annealing conditions may further include a gas pressure in a range from about 1 Torr to about 1000 Torr, or in a range from about 10 Torr to about 100 Torr, substrate temperature in a range from about 100° C. to about 500° C., or in a range from about 200° C. to about 400° C., and annealing times in a range from about 1 min to about 30 minutes. However, embodiments of the invention are not limited by these conditions as other annealing conditions may be utilized. In some embodiments of the invention, the gas pressure may be in a range from about 0.1 Torr to about 100 Torr, or in a range from about 0.5 Torr to about 10 Torr.

According to embodiments of the invention, following the annealing of the portion 205 containing the continuous Cu metal layer 228, additional Cu metal layer 230 is plated on the annealed continuous Cu metal layer 248 in a second Cu plating bath. In the exemplary embodiment depicted in FIG. 1G, the additional Cu metal layer 230 fills the recessed feature 209 and includes a lower additional Cu metal portion 235 in the recessed feature and an upper additional Cu metal portion 240 outside the opening of the recessed feature 209. A thickness of the upper additional Cu metal portion 240 can be in the range from 100 nm to 2000 nm, or in the range from 250 nm and 750 nm.

According to some embodiments of the invention, the first and second Cu plating baths may be the same. According to other embodiments, the first and second Cu plating baths may have different chemical compositions. The chemical compositions may, for example, differ in one or more of reducing agent concentrations, surfactant concentrations, and sources and concentrations of copper ions. According to some embodiments of the invention, the second Cu plating bath may be configured to contain a higher concentration of copper ions than the first Cu plating bath and be capable of plating Cu metal in a recessed feature at a faster rate than the first Cu plating bath.

Figure 1H:
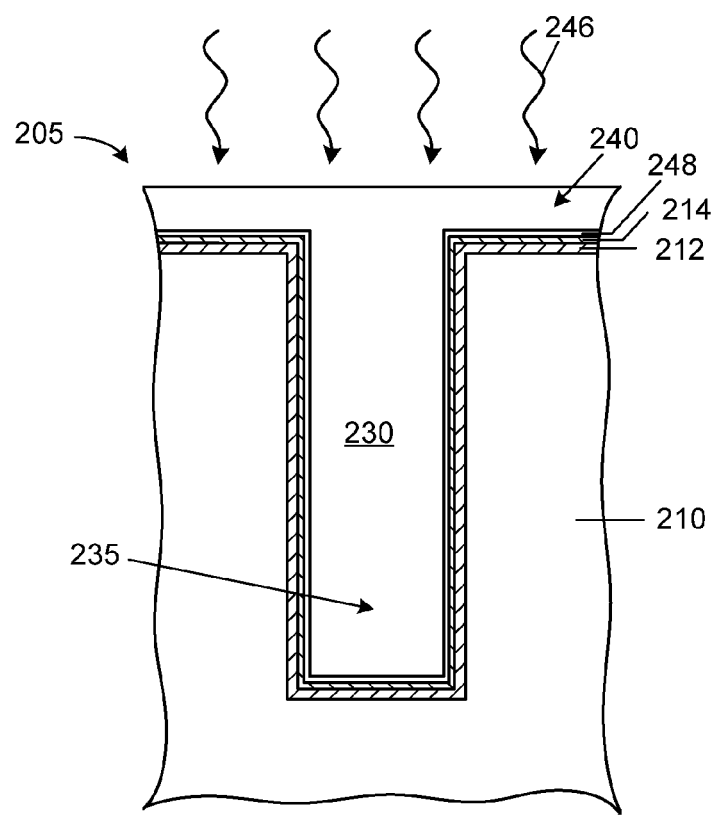

Following deposition of the additional Cu metal layer 230, the portion 205 may be annealed in a non-oxidizing gas to further improve material properties of the additional Cu metal layer 230. The annealing forms large Cu grains in the additional Cu metal layer 230. In FIG. 1H, arrows 246 represent annealing or heat-treating of the additional Cu metal layer 230. The non-oxidizing gas may contain an inert gas, $H_2$ gas, or a combination thereof. In one example, the additional Cu metal layer 230 may be annealed in a $H_2$-containing gas that consists of $H_2$ gas, or consists of a combination of $H_2$ gas and an inert gas. The inert gas may be selected from $N_2$ gas and the noble gases (i.e., He, Ne, Ar, Kr, and Xe). Furthermore, the $H_2$-containing gas may be plasma excited or not plasma excited. Combinations of $H_2$ and an inert gas can, for example, include 90% $H_2$ or less, for example 80%, 60%, 20%, 10%, 5%, or less, and balance inert gas. The $H_2$-containing gas may contain or consist of forming gas. Exemplary annealing conditions may further include a gas pressure in a range from about 1 Torr to about 1000 Torr, or in a range from about 10 Torr to about 100 Torr, substrate temperature in a range from about 100° C. to about 500° C., or in a range from about 200° C. to about 400° C., and annealing times in a range from about 1 min to about 30 minutes. However, embodiments of the invention are not limited by these conditions as other annealing conditions may be utilized. In some embodiments of the invention, the gas pressure may be in a range from about 0.1 Torr to about 100 Torr, or in a range from about 0.5 Torr to about 10 Torr.

Figure 1I:
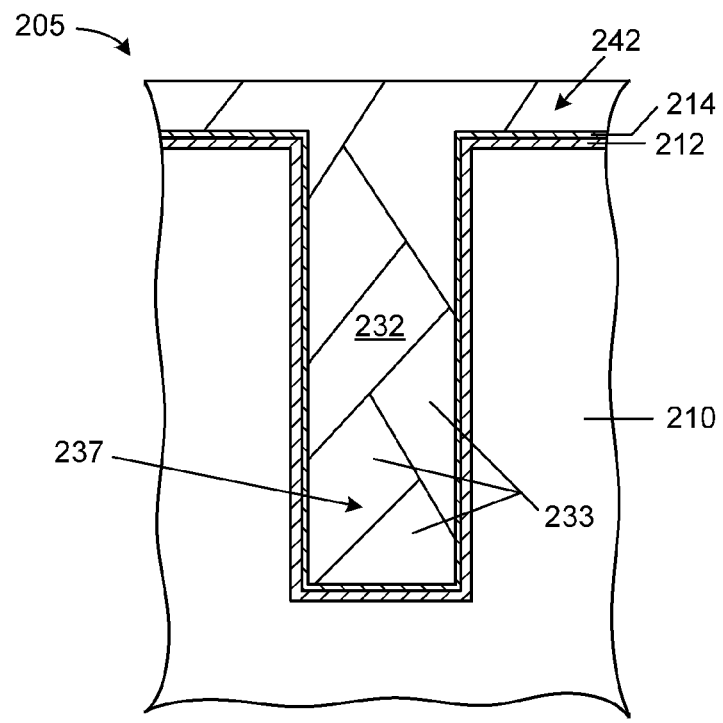

FIG. 1I schematically shows annealed additional Cu metal layer 232 following the annealing. The annealed additional Cu metal layer 232 includes a lower annealed Cu metal portion 237 in the recessed feature and an upper annealed Cu metal portion 242 outside the opening of the recessed feature 209. The annealed additional Cu metal layer 232 contains large Cu grains 233 that include the Cu material from the annealed continuous Cu metal layer 228. In other words, the growth of the large Cu grains 233 is from not just the additional Cu metal layer 232, but also from the continuous Cu metal layer 228 such that the large Cu grains 233 form on the continuous Ru metal film 214 throughout the entire recessed feature 209. The formation of the large Cu grains 233 in the entire recessed feature 209 by the annealing is enabled by the continuous Cu metal layer 228 and its superior continuous adhesion to the continuous Ru metal film 214. In general, it was observed that the size of the large Cu grains 233 in the recessed feature increased with increased thickness of the upper annealed Cu metal portion 242.

Figure 1J:
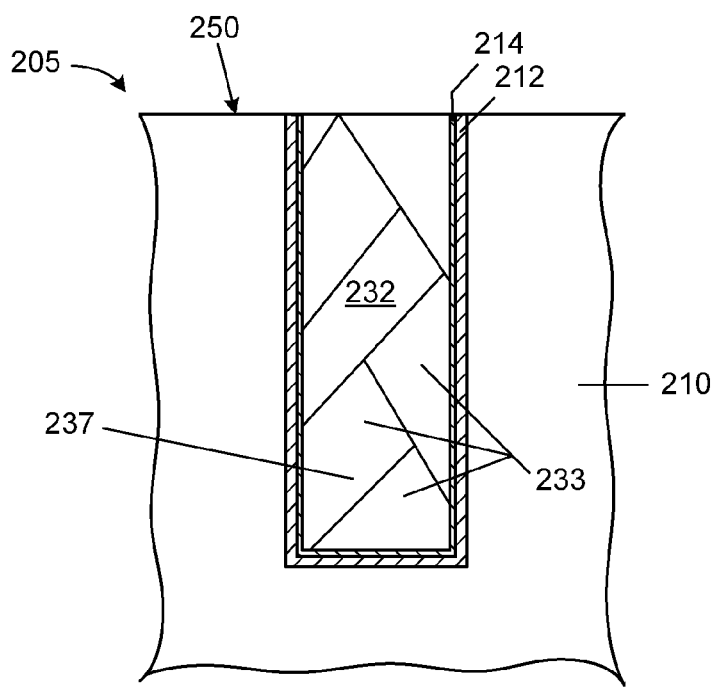

FIG. 1J shows the portion 205 where the upper annealed Cu metal portion 242 and portions of the annealed diffusion barrier film 212 and continuous Ru metal film 214 have been removed, typically by a chemical mechanical polishing (CMP) method, to form a planarized surface 250.

Figure 1K:
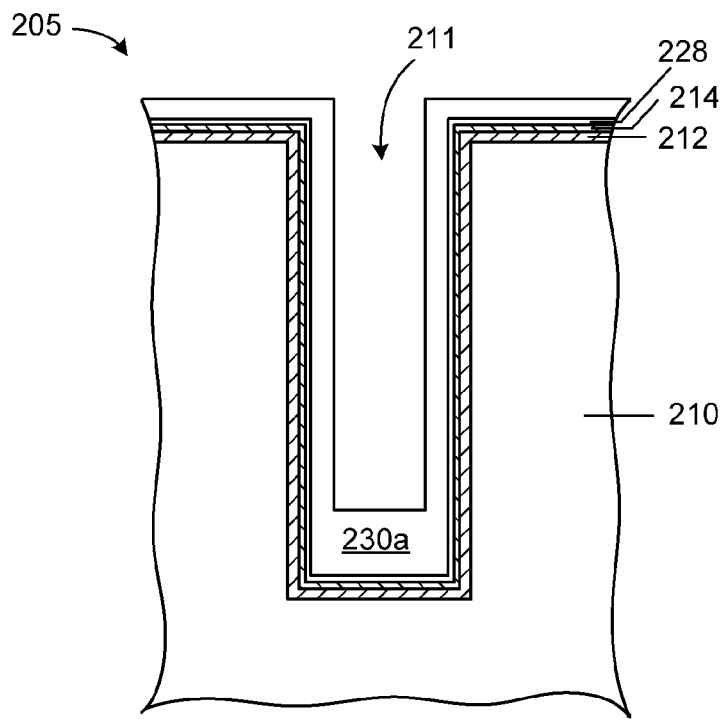

Referring now to FIGS. 1E, 1F and 1K, according to other embodiments of the invention, following the annealing of the continuous Cu metal layer 228, the plating of the additional Cu metal may only partially fill recessed feature 209. FIG. 1K shows a partially filled recessed feature 211 containing additional Cu metal layer 230a following a Cu plating process. According to embodiments of the invention, a percentage of the depth and/or volume of the recessed feature 211 in FIG. 1K that is filled with Cu metal by plating the additional Cu metal may be less than about 50%, less than about 40%, less than about 30%, less than v20%, or even less than about 10%. The Cu plating of additional Cu metal layer 230a may be repeated a plurality of times to further fill the recessed feature 211. Each plating process may be followed by an annealing process using a non-oxidizing gas.

Figure 1L:
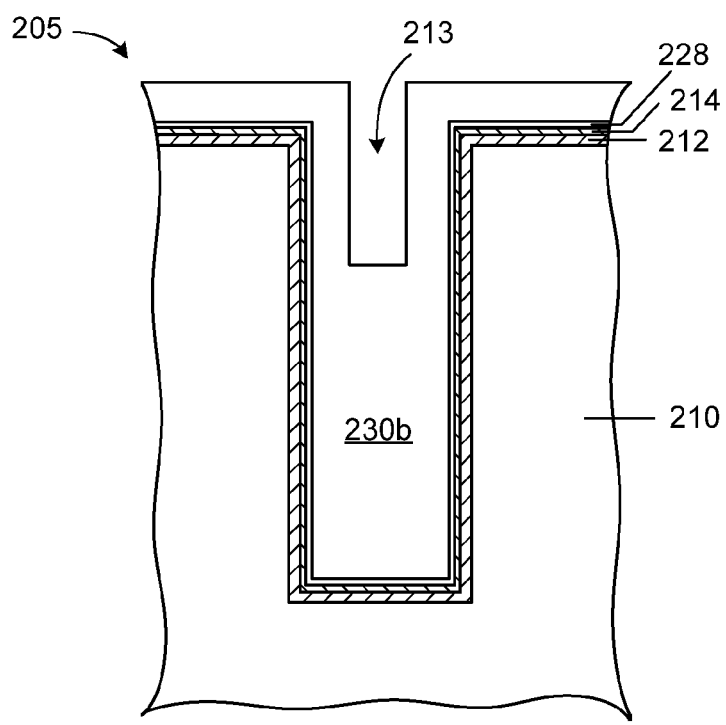

Referring now to FIGS. 1E, 1F and 1L, according to other embodiments of the invention, following the annealing of the continuous Cu metal layer 228, the plating of the additional Cu metal may substantially fill the recessed feature 209. FIG. 1L shows a substantially filled recessed feature 213 containing additional Cu metal layer 230b following a Cu plating process. According to embodiments of the invention, a percentage of the depth and/or volume of the recessed feature 213 in FIG. 1L that is filled with Cu metal by plating the additional Cu metal may be greater than about 50%, greater than about 60%, greater than about 70%, greater than about 80%, or even greater than v90%. The Cu plating of additional Cu metal layer 230b may be repeated a plurality of times to further fill the recessed feature 213. Each plating process is followed by an annealing process using a non-oxidizing gas.

Thus, in all embodiments, the additional Cu metal layer (230, 230a, 230b) is plated to further fill the recessed feature to a second width, depth, and volume that is greater than the first width, depth and volume to which the continuous Ru metal film 214 and continuous Cu metal layer 228 fill the recessed feature. Further the second width, depth, and volume to which the recessed feature is filled may be less than or equal to 100% of the width, depth, and volume of the recessed feature. In addition, the second width, depth, and volume may be less than 100%, and the method may further include repetition of the plating and annealing of addition Cu metal one or more desired times until a third width, depth, and volume is achieved in which the recessed feature is further filled, for example to about 90% to 100% of the width, depth, and volume of the recessed feature. In one embodiment, the first width, depth, and volume is less than about 20% of the width, depth, and volume of the recessed feature, the second width, depth, and volume is greater than about 20% and less than about 50% of the width, depth, and volume of the recessed feature, and the third width, depth, and volume is 100% of the width, depth, and volume of the recessed feature.

A simplified recessed feature 206 was illustrated and described above in FIG. 1A, but embodiments of the invention may be applied to other types of recessed features found in integrated circuit design. FIGS. 2A-2B schematically show cross-sectional views of other recessed features known in the art on which embodiments of the invention may be implemented. Processing methods for forming the patterned structures depicted in FIGS. 2A and 2B are well known to one skilled in the art. As will be appreciated by one of ordinary skill in the art, embodiments of the invention can be readily applied to the recessed features depicted in FIGS. 2A and 2B.

FIG. 2A schematically shows a cross-sectional view of a dual damascene interconnect structure. Dual damascene interconnect structures are well known by one of ordinary skill in the art of integrated circuit fabrication. The dual damascene interconnect structure depicted in FIG. 2A contains a dual damascene interconnect recessed feature 264 formed over a conductive interconnect structure 262. The dual damascene interconnect recessed feature 264 contains a via 268 having sidewall and bottom surfaces 268*a* and 268*b*, respectively, and a trench 266 formed in dielectric film 258, where the trench 266 contains sidewall and bottom surfaces 266*a* and 266*b*, respectively. The trench 266 may be used for an upper conductive interconnect structure and the via 268 connects the trench 266 to the conductive interconnect structure 262. The interconnect structure further contains dielectric layers 252 and 254, barrier film 260 surrounding the conductive interconnect structure 262, and etch stop layer 256. According to one embodiment, following deposition of a barrier film (not shown) in the dual damascene interconnect recessed feature 264, at least a portion of the barrier film may be removed by plasma etching from the bottom surface 268*b* prior to depositing a Ru metal film (not shown) in the dual damascene interconnect recessed feature 264 in accordance with a method of the present invention. The plasma etching provides for directly contacting the Ru metal film to the conductive interconnect structure 262. According to another embodiment, at least a portion of the barrier film and the Ru metal film may be removed by plasma etching from the bottom surface 268*b*, thereby providing for directly contacting the continuous Cu metal layer to the conductive interconnect structure 262 in the dual damascene interconnect recessed feature 264.

FIG. 2B schematically shows a cross-sectional view of another patterned structure known in the art of integrated circuit design upon which embodiments of the invention may be implemented. The patterned structure contains a recessed feature 275*a* formed in a dielectric film 272 and a conductive layer 273*a* formed on a gate electrode 276 at the bottom of the recessed feature 275*a*. The gate electrode 276 is part of a gate structure that further contains a gate dielectric film 277. The gate dielectric film 277 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or BaO, or combinations of two or more thereof.

Furthermore, the patterned structure in FIG. 2B contains a recessed feature 275*b* formed in the dielectric film 272 and a conductive layer 273*b* formed on a doped substrate region 271 (e.g., a drain or a source region) in the substrate 270 at the bottom of the recessed feature 275*b*. The substrate 270 can, for example, be a 200 mm Si wafer, a 300 mm Si wafer, or an even larger Si wafer. The dielectric film 272 can contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, and/or halogens, either as dense or porous materials. According to an embodiment of the invention, the recessed features 275*a*, 275*b* can be vias with aspect ratios (depth/width) greater than or equal to about 2:1, for example 3:1, 4:1, 5:1, 6:1, 12:1, 15:1, or higher. The vias can have widths of about 200 nm or less, for example 150 nm, 100 nm, 65 nm, 45 nm, 32 nm, 20 nm, or lower. In one example, the recessed features 275*a*, 275*b* can be 45 nm wide vias with aspect ratios of about 7. However, embodiments of the invention are not limited to these aspect ratios or via widths, as other aspect ratios or via widths may be utilized. The conductive layers 273*a* and 273*b* can include silicide contact layers that provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Thus, as will be appreciated by one of ordinary skill in the art, embodiments of the invention can be readily applied to the structures depicted in FIGS. 2A-2B.

Figure 3:
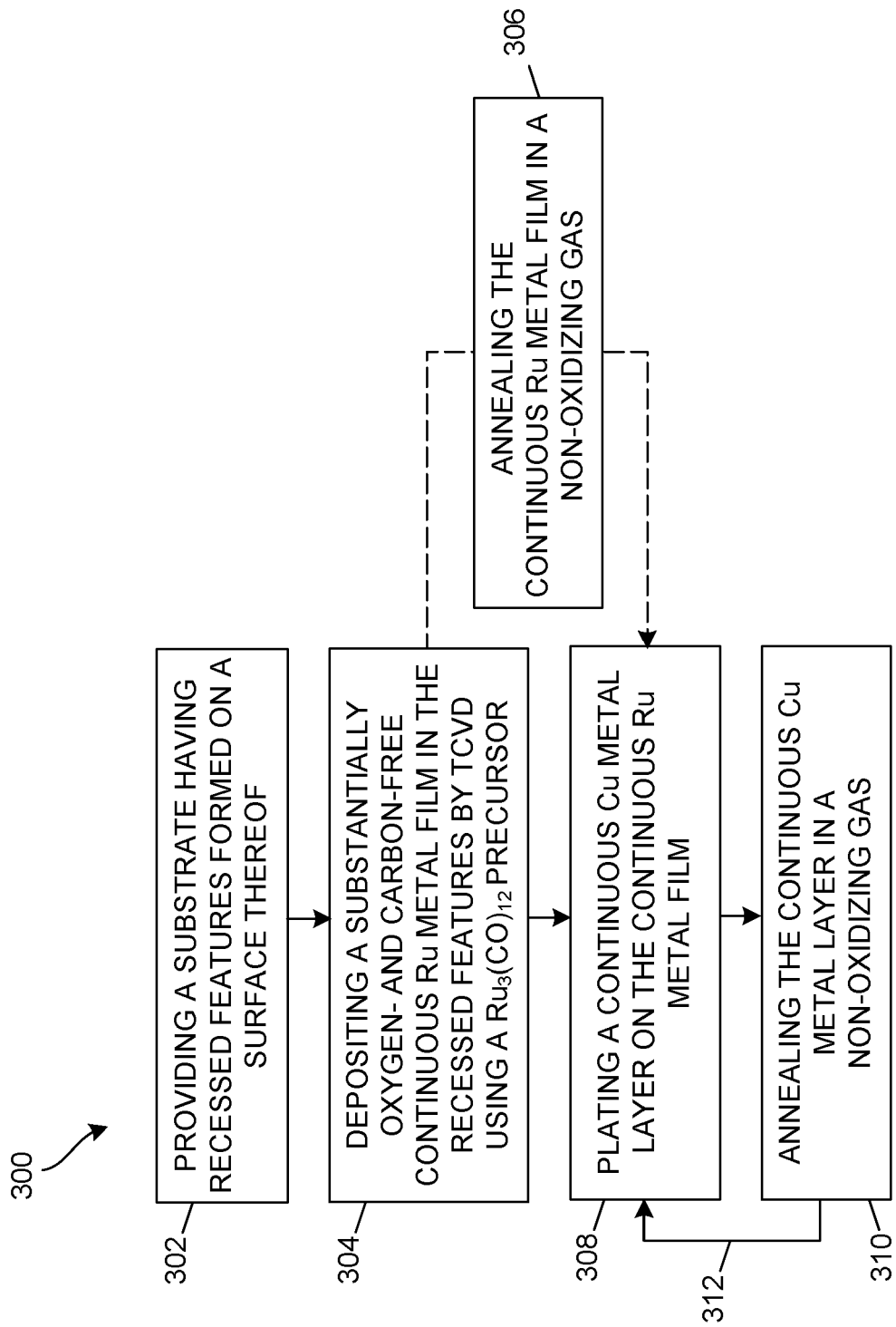
FIG. 3 is a process flow diagrams for Cu plating on a continuous Ru film in recessed features according to an embodiment of the invention.

FIG. 3 is a process flow diagram for Cu plating on a continuous Ru film in recessed features according to an embodiment of the invention. It should be noted that in this application, the term "step" does not prohibit two steps from being performed simultaneously or partially overlapping in time. In FIG. 3, the process 300 includes in step 302, providing a substrate having recessed features formed on a surface thereof. The recessed feature can, for example, contain a via, a trench, or a combination thereof, and can be formed in a Si substrate or in a dielectric film. The substrate surface can contain an exposed diffusion barrier layer. The barrier film can, for example, contain Ta, TaN, TaC, TaCN, Ti, TiN, TiC, TiCN, W, WN, WC, or WCN, or a combination thereof.

In step 304, a substantially oxygen- and carbon-free continuous Ru film is deposited in the recessed features by TCVD using a process gas containing a $Ru_3(CO)_{12}$ precursor, where the process gas may further contain a CO carrier gas. The continuous Ru metal film can have a thickness in a range from about 1 nm to about 20 nm.

In optional step 306, the continuous Ru metal film may be annealed in a non-oxidizing gas. The non-oxidizing gas may contain an inert gas, $H_2$ gas, or a combination thereof.

In step 308, a continuous Cu metal layer is plated on the continuous Ru metal film in a processing system configured for Cu plating and annealing. The Cu plating process may be an electrochemical Cu plating process or an electroless Cu plating process. The continuous Ru metal film is contacted with a Cu plating bath for a period of time to allow deposition of a continuous Cu metal layer, and subsequently the substrate is removed from the Cu plating bath.

In step 310, the continuous Cu metal layer is annealed in a non-oxidizing gas. The non-oxidizing gas may contain an inert gas, $H_2$ gas, or a combination thereof.

As shown by process arrow 312, the plating and annealing steps 308 and 310 may be repeated any number of times to at least partially fill the recessed features with large Cu metal grains that are formed on the Ru continuous Ru metal film from both the first deposited and annealed continuous Cu metal layer and the additional deposited and annealed Cu metal layers.

Figure 4:
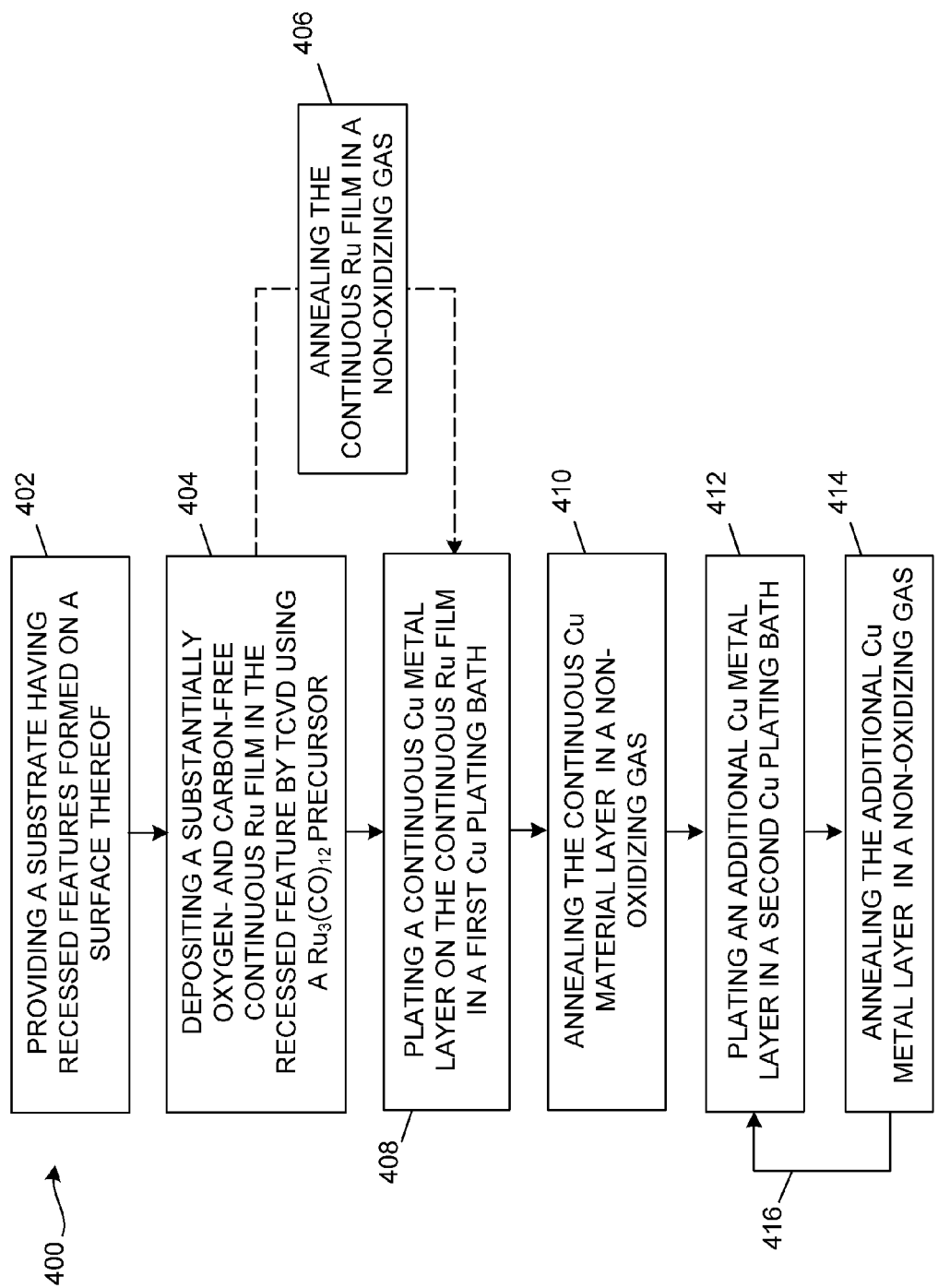
FIG. 4 is a process flow diagrams for Cu plating on a continuous Ru film in recessed features according to an embodiment of the invention.

FIG. 4 is a process flow diagram for Cu plating on a continuous Ru film in recessed features according to another embodiment of the invention. The process 400 in FIG. 4 is similar to the process 300 shown in FIG. 3 and described above. In step 402, a substrate having recessed features formed on a surface thereof is provided. The recessed feature can, for example, contain a via, a trench, or a combination thereof, and can be formed in a Si substrate or in a dielectric film. The substrate surface can contain an exposed diffusion barrier layer. The barrier film can, for example, contain Ta, TaN, TaC, TaCN, Ti, TiN, TiC, TiCN, W, WN, WC, or WCN, or a combination thereof.

In step 404, a substantially oxygen-and carbon-free continuous Ru metal film is deposited in the recessed features by TCVD using a process gas containing a $Ru_3(CO)_{12}$ precursor, where the process gas may further contain a CO carrier gas. The continuous Ru metal film can have a thickness in a range from about 1 nm to about 20 nm.

In optional step 406, the continuous Ru film may be annealed in a non-oxidizing gas. The non-oxidizing gas may contain an inert gas, $H_2$ gas, or a combination thereof.

In step 408, a continuous Cu metal layer is plated on the continuous Ru metal film in a processing system configured for Cu plating and annealing. The Cu plating process may be an electrochemical Cu plating process or an electroless Cu plating process. The continuous Ru metal film is contacted with a first Cu plating bath for a period of time to allow deposition of a continuous Cu metal layer, and subsequently the substrate is removed from the Cu plating bath.

In step 410, the continuous Cu metal layer is annealed in a non-oxidizing gas. The non-oxidizing gas may contain an inert gas, $H_2$ gas, or a combination thereof.

In step 412, an additional Cu metal layer is plated in a second Cu plating bath. The Cu plating process may be an electrochemical Cu plating process or an electroless Cu plating process. The continuous Cu metal film is contacted with a second Cu plating bath for a period of time to allow deposition of an additional Cu metal layer, and subsequently the substrate is removed from the second Cu plating bath.

In step 414, the additional Cu metal layer is annealed in a non-oxidizing gas. The non-oxidizing gas may contain an inert gas, $H_2$ gas, or a combination thereof.

As shown by process arrow 416, the plating and annealing steps 412 and 414 may be repeated any number of times to at least partially fill the recessed features with large Cu metal grains that include the annealed continuous Cu metal layer and the annealed additional Cu metal layer(s).

According to some embodiments of the invention, the first and second Cu plating baths may be the same. According to other embodiments, the first and second Cu plating baths may have different chemical compositions. The chemical compositions may, for example, differ in one or more of reducing agent concentrations, surfactant concentrations, and sources and concentrations of copper ions. According to one embodiment of the invention, the second Cu plating bath may be configured to contain a higher concentration of copper ions than the first Cu plating bath and be capable of plating Cu metal in the recessed feature at a faster rate than the first Cu plating bath.

Figure 5A:
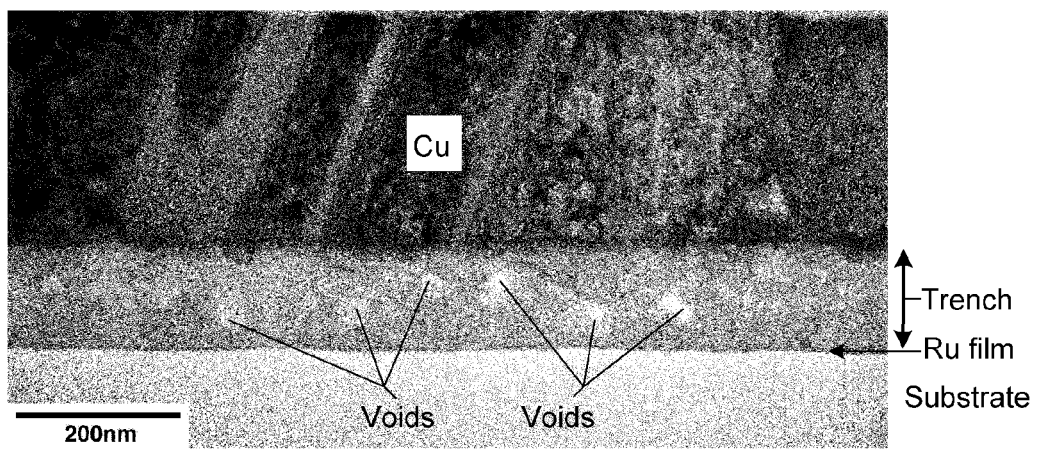
FIGS. 5A and 5B are side-view transmission electron micrographs (TEMs) of a Cu filled trench containing a Cu seed layer deposited by physical vapor deposition (PVD) on a continuous Ru metal film.
Figure 5B:
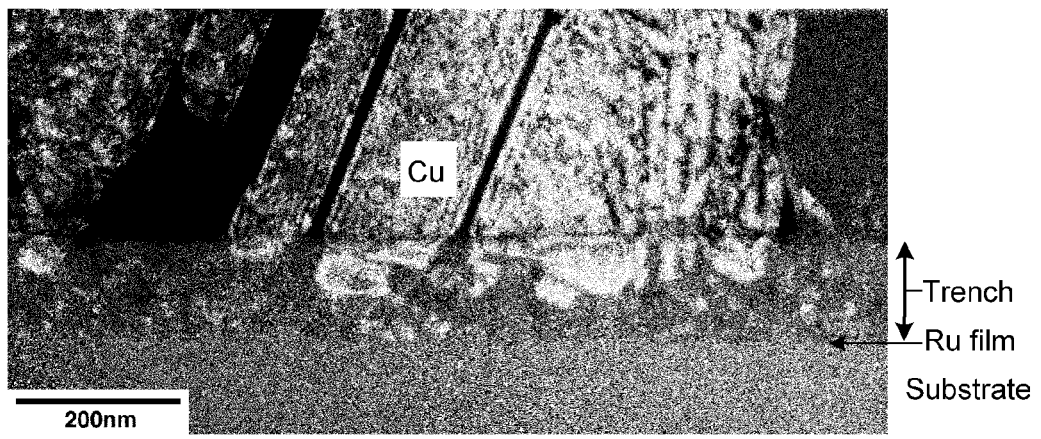

FIGS. 5A and 5B are side-view transmission electron micrographs (TEMs) of a Cu over-filled trench containing a conventional Cu seed layer deposited by physical vapor deposition (PVD) on a continuous Ru metal film. The trench had a width of 40 nm. The TEM in FIG. 5A was acquired in Bright Field mode and the TEM in FIG. 5B was acquired in Dark Field mode. FIGS. 5A and 5B illustrate several problems encountered in Cu plating of narrow recessed features found in advanced integrated circuits. The plated and annealed Cu metal contains micro-voids in the trench that are visible in FIG. 5A and the large Cu metal grains that form during annealing and crystallization of the Cu metal do not extend to the bottom of the trench, but instead, as clearly seen in FIG. 5B, only small Cu grains, are present near the bottom of the trench. In other words, when a conventional PVD Cu seed layer is deposited in the trench, and Cu metal is plated to fill the trench, large Cu grains are not formed in the entire trench.

Since scaling of future semiconductor devices will continue to ever smaller minimum feature sizes, this problem will become increasingly important for void-free Cu filling of large grain Cu with low resistivity and good reliability.

Figure 5C:
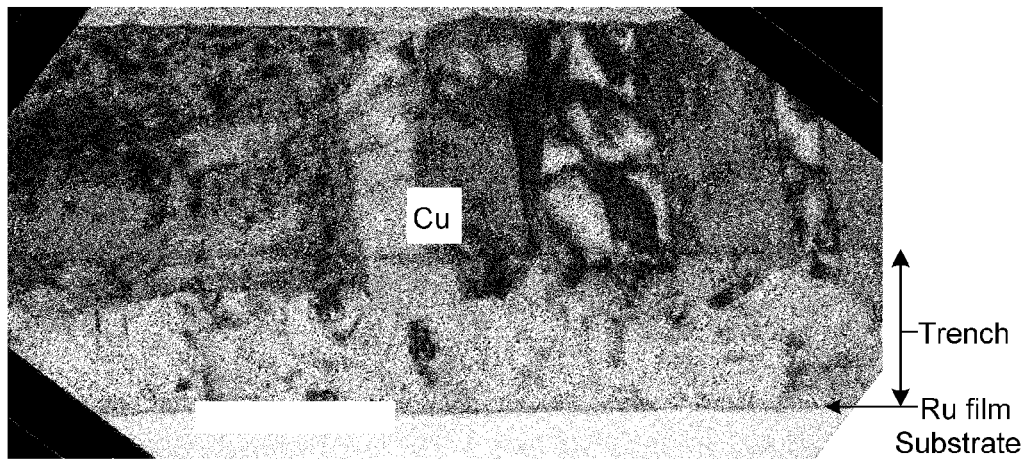
FIG. 5C is a side-view TEM of a Cu filled trench containing a plated Cu metal layer on a continuous Ru film according to an embodiment of the invention.

FIG. 5C is a side-view TEM of a trench over-filled with Cu metal according to a method of the current invention. The TEM was taken in Bright Field mode following plating of a continuous Cu metal layer on a continuous Ru metal film, annealing of the continuous Cu metal layer in a non-oxidizing gas, plating of additional Cu metal layer on the annealed Cu metal layer, and annealing of the additional Cu metal layer in a non-oxidizing gas. The entire plated and annealed Cu metal shown in FIG. 5C is at least substantially void-free and contains large Cu grains in the entire trench on the continuous Ru metal film. Thus, unlike the Cu metal fill shown in FIGS. 5A and 5B, the large Cu grains shown in FIG. 5C include the annealed continuous Cu seed layer. The results depicted in FIG. 5C clearly show that this process sequence unexpectedly allows for enhanced Cu grain penetration into the trench and the growth of large Cu grains that include the entire trench, thereby providing a highly reliable Cu metallization process. The large Cu grains lower the electrical resistivity of the Cu filled recessed features and increase the reliability of the integrated circuit.

Figure 6:
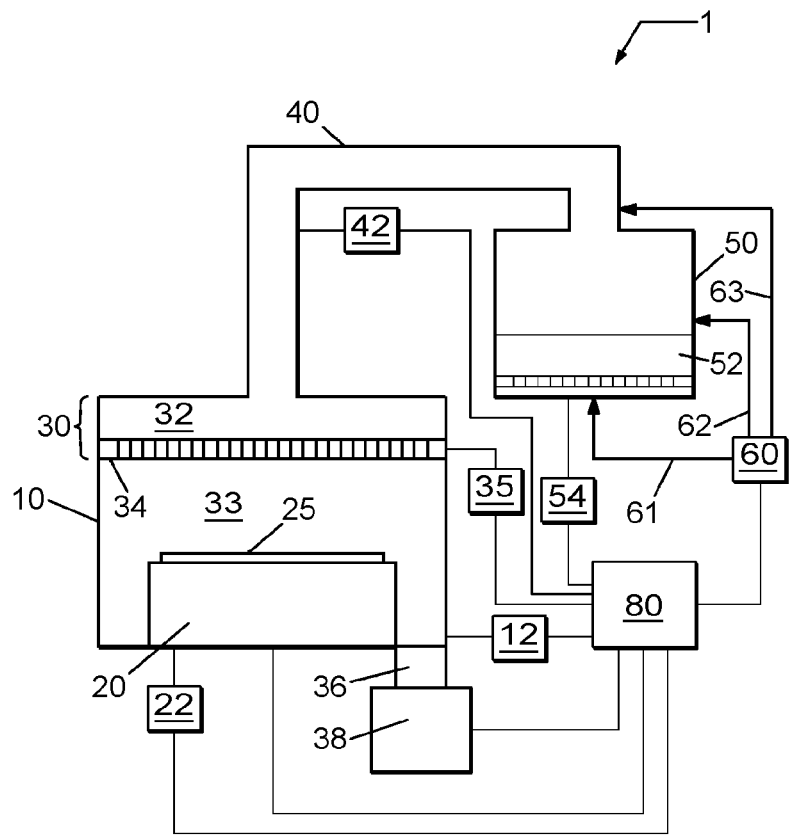
FIG. 6 depicts a schematic view of a thermal chemical vapor deposition (TCVD) system for depositing a Ru metal film according to an embodiment of the invention.

FIG. 6 depicts a schematic view of a thermal chemical vapor deposition (TCVD) system for depositing a Ru metal film from a $Ru_3(CO)_{12}$ precursor vapor and a CO gas according to an embodiment of the invention. The deposition system 1 includes a process chamber 10 having a substrate holder 20 configured to support a patterned substrate 25 upon which the Ru metal film is formed. The process chamber 10 is coupled to a metal precursor vaporization system 50 via a vapor precursor delivery system 40.

The process chamber 10 is further coupled to a vacuum pumping system 38 through a duct 36, wherein the vacuum pumping system 38 is configured to evacuate the process chamber 10, vapor precursor delivery system 40, and metal precursor vaporization system 50 to a pressure suitable for forming the Ru metal film on the patterned substrate 25, and suitable for vaporization of the $Ru_3(CO)_{12}$ precursor 52 in the metal precursor vaporization system 50.

Still referring to FIG. 6, the metal precursor vaporization system 50 is configured to store a $Ru_3(CO)_{12}$ precursor 52, to heat the $Ru_3(CO)_{12}$ precursor 52 to a temperature sufficient for vaporizing the $Ru_3(CO)_{12}$ precursor 52, and to introduce $Ru_3(CO)_{12}$ precursor vapor to the vapor precursor delivery system 40. The $Ru_3(CO)_{12}$ precursor 52 is a solid under the selected heating conditions in the metal precursor vaporization system 50. In order to achieve the desired temperature for subliming the solid $Ru_3(CO)_{12}$ precursor 52, the metal precursor vaporization system 50 is coupled to a vaporization temperature control system 54 configured to control the vaporization temperature.

For instance, the temperature of the $Ru_3(CO)_{12}$ precursor 52 may be elevated to between approximately 40° C. to approximately 150° C. Alternately, the vaporization temperature can be maintained at approximately 60° C. to approximately 90° C. As the $Ru_3(CO)_{12}$ precursor 52 is heated to cause sublimation, a CO-containing gas is passed over or through the $Ru_3(CO)_{12}$ precursor 52 to capture the $Ru_3(CO)_{12}$ precursor vapor as it is being formed. The CO-containing gas contains CO and optionally an inert carrier gas, such as $N_2$, or a noble gas (i.e., He, Ne, Ar, Kr, or Xe), or a combination thereof. Vaporizing the $Ru_3(CO)_{12}$ precursor in the presence of CO gas can reduce problems that limit the delivery of the $Ru_3(CO)_{12}$ precursor vapor to the patterned substrate. It has been shown that addition of the CO gas to the $Ru_3(CO)_{12}$ precursor vapor as it is being formed allows for increasing the vaporization temperature. The elevated temperature increases the vapor pressure of the $Ru_3(CO)_{12}$ precursor, resulting in increased delivery of the $Ru_3(CO)_{12}$ precursor to the process chamber and, hence, increased deposition rate of a Ru metal film on the patterned substrate 25.

In one example, the metal precursor vaporization system 50 may be a multi-tray vaporization system configured for efficient vaporization and transport of the $Ru_3(CO)_{12}$ vapor. An exemplary multi-tray vaporization system is described in U.S. patent application Ser. No. 10/998,420, titled "Multi-Tray Film Precursor Evaporation System and Thin Film Deposition System Incorporating Same", filed on Nov. 29, 2004.

For example, a gas supply system 60 is coupled to the metal precursor vaporization system 50, and it is configured to, for instance, supply CO, a carrier gas, or a mixture thereof, beneath the $Ru_3(CO)_{12}$ precursor 52 via feed line 61, or over the $Ru_3(CO)_{12}$ precursor 52 via feed line 62. In addition, the gas supply system 60 is coupled to the vapor precursor delivery system 40 downstream from the metal precursor vaporization system 50 to supply the gas to the vapor of the $Ru_3(CO)_{12}$ precursor 52 via feed line 63 as or after it enters the vapor precursor delivery system 40. Furthermore, the feed line 63 may be utilized to pre-treat the patterned substrate 25 with a pre-treatment gas containing CO gas to saturate the exposed surfaces of the patterned substrate 25 with adsorbed CO prior to exposing the patterned substrate 25 to $Ru_3(CO)_{12}$ precursor vapor and CO gas.

Although not shown, the gas supply system 60 can comprise a carrier gas source, a CO gas source, one or more control valves, one or more filters, and a mass flow controller. For instance, the flow rate of the carrier gas can be between about 0.1 standard cubic centimeters per minute (sccm) and about 1000 sccm. Alternately, the flow rate of the carrier gas can be between about 10 sccm and about 500 sccm. Still alternately, the flow rate of the CO-containing gas can be between about 50 sccm and about 200 sccm. According to embodiments of the invention, the flow rate of the CO-containing gas can range from approximately 0.1 sccm to approximately 1000 sccm. Alternately, the flow rate of the CO-containing gas can be between about 1 sccm and about 500 sccm.

Downstream from the metal precursor vaporization system 50, the process gas containing the $Ru_3(CO)_{12}$ precursor vapor and CO gas flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the $Ru_3(CO)_{12}$ precursor vapor as well as condensation of the $Ru_3(CO)_{12}$ precursor vapor. The vapor precursor delivery system 40 can, for example, be maintained at a temperature between 50° C. and 100° C.

Still referring to FIG. 6, the vapor distribution system 30, which forms part of and is coupled to the process chamber 10, comprises a vapor distribution plenum 32 within which the vapor disperses prior to passing through a vapor distribution plate 34 and entering a processing zone 33 above the patterned substrate 25. In addition, the vapor distribution plate 34 can be coupled to a distribution plate temperature control system 35 configured to control the temperature of the vapor distribution plate 34.

Once the process gas containing the $Ru_3(CO)_{12}$ precursor vapor and CO gas enters the processing zone 33 of process chamber 10, the $Ru_3(CO)_{12}$ precursor vapor thermally decomposes upon adsorption at the substrate surface due to the elevated temperature of the patterned substrate 25, and a Ru metal film is formed on the patterned substrate 25. The substrate holder 20 is configured to elevate the temperature of the patterned substrate 25 by virtue of the substrate holder 20 being coupled to a substrate temperature control system 22. For example, the substrate temperature control system 22 can be configured to elevate the temperature of the patterned substrate 25 up to approximately 500° C. Additionally, the process chamber 10 can be coupled to a chamber temperature control system 12 configured to control the temperature of the chamber walls.

Still referring to FIG. 6, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 7:
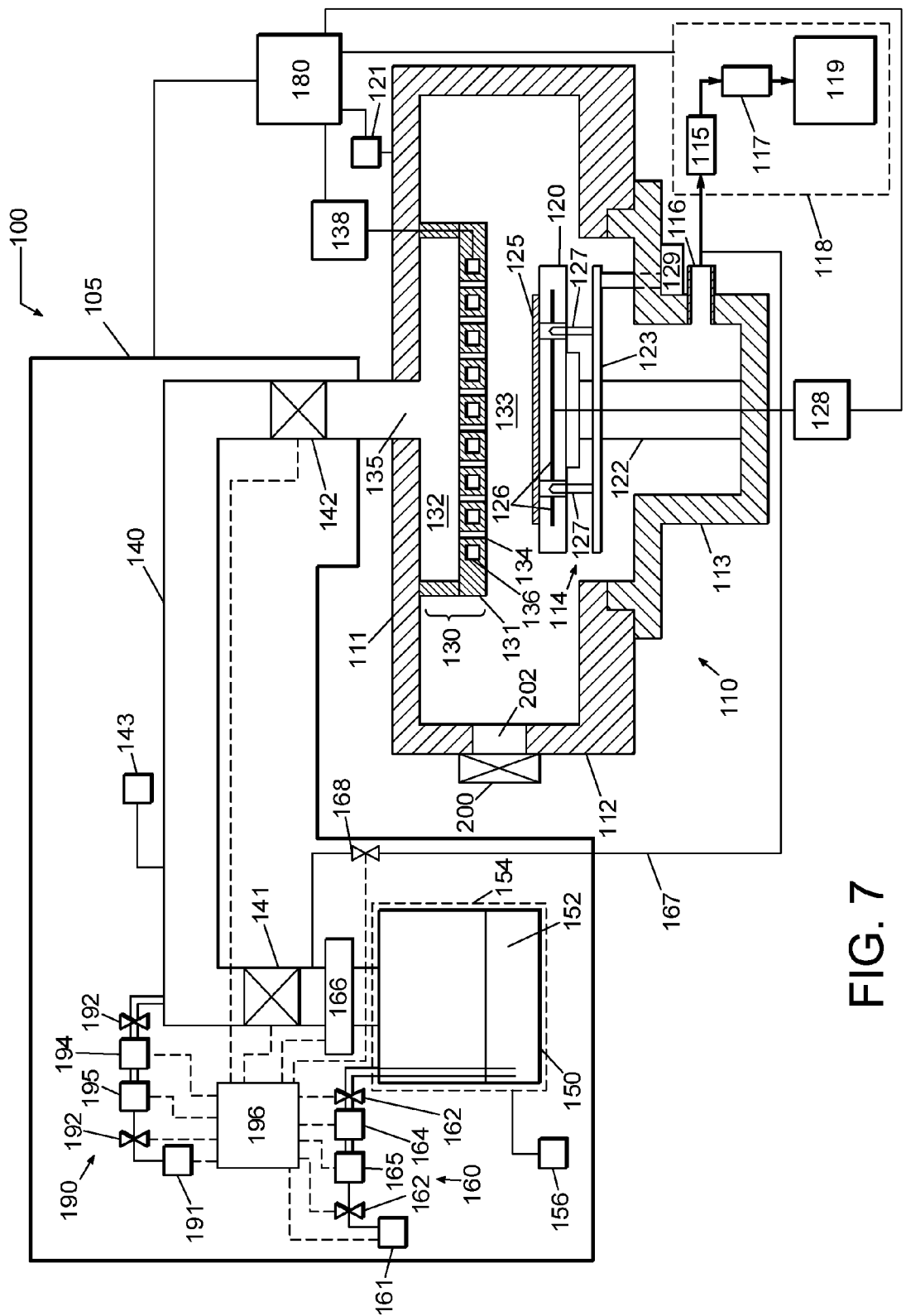
FIG. 7 depicts a schematic view of another TCVD system for depositing a Ru metal film according to another embodiment of the invention.

FIG. 7 depicts a schematic view of another TCVD system for depositing a Ru metal film from a $Ru_3(CO)_{12}$ precursor vapor and a CO gas according to an embodiment of the invention. The deposition system 100 comprises a process chamber 110 having a substrate holder 120 configured to support a patterned substrate 125 upon which the Ru metal film is formed. The process chamber 110 is coupled to a precursor delivery system 105 having metal precursor vaporization system 150 configured to store and vaporize a $Ru_3(CO)_{12}$ precursor 152, and a vapor precursor delivery system 140 configured to transport the vapor of the $Ru_3(CO)_{12}$ precursor 152 to the process chamber 110.

The process chamber 110 comprises an upper chamber section 111, a lower chamber section 112, and an exhaust chamber 113. An opening 114 is formed within lower chamber section 112, where lower chamber section 112 couples with exhaust chamber 113.

Still referring to FIG. 7, substrate holder 120 provides a horizontal surface to support a patterned substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the patterned substrate 125 or substrate holder 120.

During processing, the heated patterned substrate 125 can thermally decompose the $Ru_3(CO)_{12}$ precursor vapor, and enable deposition of a Ru metal film on the patterned substrate 125. The substrate holder 120 is heated to a pre-determined temperature that is suitable for depositing the desired Ru metal film onto the patterned substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 500 mTorr. Alternately, the process chamber pressure can be between about 10 mTorr and about 100 mTorr.

Also shown in FIG. 7, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above the patterned substrate 125 through one or more orifices 134.

Furthermore, an opening 135 is provided in the upper chamber section 111 for introducing a process gas containing $Ru_3(CO)_{12}$ precursor vapor and CO gas from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the $Ru_3(CO)_{12}$ precursor vapor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the vapor distribution plate 131.

As illustrated in FIG. 7, a metal precursor vaporization system 150 is configured to hold a $Ru_3(CO)_{12}$ precursor 152 and to evaporate (or sublime) the $Ru_3(CO)_{12}$ precursor 152 by elevating the temperature of the $Ru_3(CO)_{12}$ precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the $Ru_3(CO)_{12}$ precursor 152 to maintain the $Ru_3(CO)_{12}$ precursor 152 at a temperature that produces a desired vapor pressure of $Ru_3(CO)_{12}$ precursor 152. The precursor heater 154 is coupled to a vaporization temperature control system 156 configured to control the temperature of the $Ru_3(CO)_{12}$ precursor 152. For example, the precursor heater 154 can be configured to adjust the temperature of the $Ru_3(CO)_{12}$ precursor 152 from about 40° C. to about 150° C., or from about 60° C. to about 90° C.

As the $Ru_3(CO)_{12}$ precursor 152 is heated to cause evaporation (or sublimation), a CO-containing gas can be passed over or through the $Ru_3(CO)_{12}$ precursor 152 to capture the $Ru_3(CO)_{12}$ precursor vapor as it is being formed. The CO-containing gas contains CO and optionally an inert carrier gas, such as $N_2$, or a noble gas (i.e., He, Ne, Ar, Kr, Xe). For example, a gas supply system 160 is coupled to the metal precursor vaporization system 150, and it is configured to, for instance, flow the CO gas over or through the $Ru_3(CO)_{12}$ precursor 152. Although not shown in FIG. 7, gas supply system 160 can also be coupled to the vapor precursor delivery system 140 to supply the CO gas to the vapor of the $Ru_3(CO)_{12}$ precursor 152 as or after it enters the vapor precursor delivery system 140, for example, to pre-treat the patterned substrate 125 with a pre-treatment gas containing CO gas to saturate the exposed surfaces of the patterned substrate 125 with adsorbed CO prior to exposing the patterned substrate 125 to a process gas containing $Ru_3(CO)_{12}$ precursor vapor and CO gas.

The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of $Ru_3(CO)_{12}$ precursor vapor delivered to the process chamber 110 can be determined using sensor 166 and mass flow controller 165. Alternately, the sensor 166 can comprise a light absorption sensor to measure the concentration of the $Ru_3(CO)_{12}$ precursor in the gas flow to the process chamber 110.

A bypass line 167 can be located downstream from sensor 166, and it can connect the vapor precursor delivery system 140 to an exhaust line 116. Bypass line 167 is provided for evacuating the vapor precursor delivery system 140, and for stabilizing the supply of the $Ru_3(CO)_{12}$ precursor vapor and CO gas to the process chamber 110. In addition, a bypass valve 168, located downstream from the branching of the vapor precursor delivery system 140, is provided on bypass line 167.

Referring still to FIG. 7, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the $Ru_3(CO)_{12}$ precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, pre-treat the patterned substrate 125 with a pre-treatment gas containing a CO gas or mix additional CO gas with the $Ru_3(CO)_{12}$ precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the $Ru_3(CO)_{12}$ precursor vapor. Sensor 166 is also connected to controller 196 and, based on output of the sensor 166, controller 196 can control the carrier gas flow through mass flow controller 165 to obtain the desired $Ru_3(CO)_{12}$ precursor flow to the process chamber 110.

As illustrated in FIG. 7, the exhaust line 116 connects exhaust chamber 113 to vacuum pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater).

Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted $Ru_3(CO)_{12}$ precursor material and by-products from the process chamber 110.

Referring back to the substrate holder 120 in the process chamber 110, as shown in FIG. 7, three substrate lift pins 127 (only two are shown) are provided for holding, raising, and lowering the patterned substrate 125. The substrate lift pins 127 are coupled to plate 123, and can be lowered to below the upper surface of substrate holder 120. A drive mechanism 129 utilizing, for example, an air cylinder provides means for raising and lowering the plate 123. The patterned substrate 125 can be transferred into and out of process chamber 110 through gate valve 200 and chamber feed-through passage 202 via a robotic transfer system (not shown), and received by the substrate lift pins 127. Once the patterned substrate 125 is received from the transfer system, it can be lowered to the upper surface of the substrate holder 120 by lowering the substrate lift pins 127.

Still referring to FIG. 7, a deposition system controller 180 includes a microprocessor, a memory, and a digital I/O port capable of generating control voltages sufficient to communicate and activate inputs of the deposition system 100 as well as monitor outputs from the deposition system 100. Moreover, the controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate holder temperature control system 128. In the vacuum pumping system 118, the controller 180 is coupled to and exchanges information with the APC 115 for controlling the pressure in the process chamber 110. A program stored in the memory is utilized to control the aforementioned components of the deposition system 100 according to a stored process recipe.

The controller 180 may be implemented as a general purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet or a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

Figure 8:
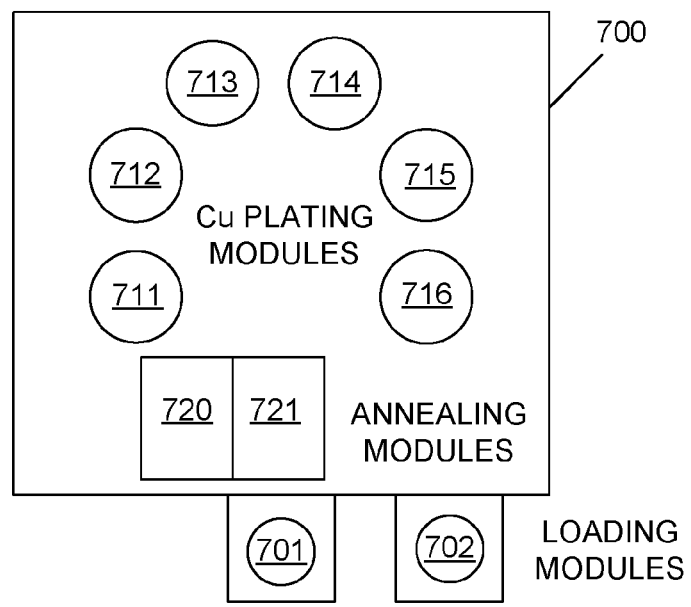
FIG. 8 depicts a schematic view of a processing system for Cu plating and annealing according to embodiments of the invention.

FIG. 8 depicts a schematic view of a processing system for Cu plating and annealing according to embodiments of the invention. The processing system 700 contains loading modules 701 and 702 for loading and unloading substrates, Cu plating modules 711-716, and annealing modules 720 and 721. The Cu plating modules 711-716 may be configured for electrochemical Cu plating or electroless Cu plating and may have different chemical compositions. The chemical compositions may, for example, differ in one or more of reducing agent concentrations, surfactant concentrations, and sources and concentrations of copper ions. The annealing modules 720-721 may be configured for annealing substrates and films thereon in a non-oxidizing gas before, between, or following one or more Cu plating processes.

A plurality of embodiments for Cu plating on a continuous Ru film in recessed features found in advanced integrated circuits has been disclosed in various embodiments. The use of a substantially oxygen-and carbon-free continuous Ru metal film helps prevent formation of undesirable microvoids during Cu metal filling of high-aspect-ratio recessed features, such as trenches and vias, and enables formation of large Cu metal grains that include an annealed continuous Cu metal layer plated onto the continuous Ru metal film and additional Cu metal plated onto the annealed Cu metal layer. The large Cu grains lower the electrical resistivity of the Cu filled recessed features and increase the reliability of the integrated circuit.

The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of filling features on a substrate surface, the method comprising:
    providing a substrate having at least one recessed feature formed on a surface thereof, the at least one recessed feature having a width, a depth and a volume;
    depositing a continuous ruthenium (Ru) metal film in the at least one recessed feature by thermal chemical vapor deposition (TCVD) using a process gas containing a $Ru_3(CO)_{12}$ precursor;
    contacting the continuous Ru metal film with a copper (Cu) plating bath to allow deposition of a continuous Cu metal layer on the continuous Ru metal film, wherein the Ru metal film and the continuous Cu metal layer together fill less than 100% of the width, depth and volume of the at least one recessed feature;
    removing the substrate from the Cu plating bath;
    annealing the continuous Cu metal layer in a non-oxidizing gas to form an annealed continuous Cu metal layer; and
    repeating the contacting, removing, and annealing to form annealed additional Cu metal in the at least one recessed feature, whereby the contacting, removing, annealing and repeating form an at least partial Cu fill in the at least one recessed feature that comprises large Cu metal grains on the continuous Ru metal film formed from the annealed continuous Cu metal layer and the annealed additional Cu metal.

2. The method of claim 1, wherein the depositing comprises depositing a substantially oxygen- and carbon-free continuous Ru metal film by thermal CVD using a process gas containing a $Ru_3(CO)_{12}$ precursor and carbon monoxide (CO) carrier gas.

3. The method of claim 1, wherein the substrate surface comprises an exposed diffusion barrier layer.

4. The method of claim 3, wherein the diffusion barrier layer comprises tantalum (Ta), tantalum nitride (TaN), tantalum carbide (TaC), tantalum carbonitride (TaCN), titanium (Ti), titanium nitride (TiN), titanium carbide (TiC), titanium carbonitride (TiCN), tungsten (W), tungsten nitride (WN), tungsten carbide (WC), or tungsten carbonitride (WCN), or a combination thereof.

5. The method of claim 1, wherein the continuous Ru metal film has a thickness in a range from about 1 nm to about 20 nm.

6. The method of claim 1, wherein annealing the continuous Cu metal layer comprises:
    exposing the continuous Cu metal layer to argon (Ar) gas, nitrogen ($N_2$) gas, or hydrogen ($H_2$) gas, or a combination thereof, at a substrate temperature in a range from about 100° C. to about 500° C.

7. The method of claim 1, wherein the at least one recessed feature comprises a via, a trench, or both a via and a trench on a partially fabricated integrated circuit.

8. The method of claim 1, wherein the contacting comprises an electrochemical Cu plating process or an electroless Cu plating process.

9. The method of claim 1, further comprising:
    annealing the continuous Ru metal film in a non-oxidizing gas comprising an inert gas or hydrogen ($H_2$) gas, or a combination thereof, at a substrate temperature in a range from about 100° C. to about 500° C.

10. A method of filling features on a substrate surface, the method comprising:
    providing a substrate having at least one recessed feature formed on a surface thereof, the at least one recessed feature having a width, a depth and a volume;
    depositing a substantially oxygen-and carbon-free continuous ruthenium (Ru) metal film in the at least one recessed feature by thermal chemical vapor deposition (TCVD) using a process gas containing a $Ru_3(CO)_{12}$ precursor and carbon monoxide (CO) carrier gas;
    contacting the continuous Ru metal film with a first copper (Cu) plating bath to allow deposition of a continuous Cu metal layer on the continuous Ru metal film, wherein the continuous Ru metal film and the continuous Cu metal layer together fill the at least one recessed feature to a first width, depth and volume less than 100% of the width, depth and volume of the at least one recessed feature;
    removing the substrate from the first Cu plating bath;
    annealing the continuous Cu metal layer in a non-oxidizing gas to form an annealed continuous Cu metal layer;
    contacting the annealed continuous Cu metal layer with a second Cu plating bath to allow deposition of an additional Cu metal layer that at least partially fills the at least one recessed feature, wherein the second Cu plating bath has a different chemical composition than the first Cu plating bath whereby the additional Cu metal layer deposits at a faster rate than the continuous Cu metal layer, and wherein the additional Cu metal layer further fills the at least one recessed feature to a second width, depth and volume greater than the first width, depth and volume and less than or equal to 100% of the width, depth and volume of the at least one recessed feature;
    removing the substrate from the second Cu plating bath; and
    annealing the additional Cu metal layer under non-oxidizing conditions, whereby large Cu metal grains are formed on the continuous Ru metal film from the annealed continuous Cu metal layer and additional Cu metal layer.

11. The method of claim 10, wherein the additional Cu metal layer further fills the at least one recessed feature to the second width, depth and volume that is less than 100% of the width, depth and volume of the at least one recessed feature, and wherein the method further comprises repeating the steps of contacting the annealed continuous Cu metal layer, removing the substrate from the second Cu plating bath, and annealing the additional Cu metal layer a desired number of times to further fill the at least one recessed feature to a third width, depth and volume of about 90% to 100% of the width, depth and volume of the at least one recessed feature.

12. The method of claim 10, wherein the second width, depth and volume is less than about 50% of the width, depth and volume of the at least one recessed feature.

13. The method of claim 10, wherein the second width, depth and volume is greater than about 50% of the width, depth and volume of the at least one recessed feature.

14. The method of claim 10, wherein the second Cu plating bath contains a higher concentration of copper ions than the first Cu plating bath.

15. The method of claim 10, wherein the substrate surface comprises an exposed diffusion barrier layer.

16. The method of claim 15, wherein the diffusion barrier layer comprises tantalum (Ta), tantalum nitride (TaN), tantalum carbide (TaC), tantalum carbonitride (TaCN), titanium (Ti), titanium nitride (TiN), titanium carbide (TiC), titanium carbonitride (TiCN), tungsten (W), tungsten nitride (WN), tungsten carbide (WC), or tungsten carbonitride (WCN), or a combination thereof.

17. The method of claim 10, wherein the continuous Ru metal film has a thickness in a range from about 1 nm to about 20 nm.

18. The method of claim 10, wherein annealing the continuous Cu metal layer and annealing the additional Cu metal layer comprises:
 exposing the continuous Cu metal layer to an inert gas or hydrogen ($H_2$) gas, or a combination thereof, at a substrate temperature in a range from about 100° C. to about 500° C.

19. The method of claim 10, further comprising:
 annealing the continuous Ru metal film in a non-oxidizing gas comprising an inert gas or hydrogen ($H_2$) gas, or a combination thereof, at a substrate temperature in a range from about 100° C. to about 500° C.

20. The method of claim 10, wherein the at least one recessed feature comprises a via, a trench, or both a via and a trench on a partially fabricated integrated circuit.

21. The method of claim 10, wherein the steps of contacting comprise an electrochemical plating process or an electroless plating process.

22. The method of claim 10, wherein the first and second Cu plating baths have different chemical compositions.

23. The method of claim 10, wherein the contacting with the second Cu plating bath further allows deposition above the at least one recessed feature to thereby overfill the at least one recessed feature.

24. A method of filling damascene features in a partially fabricated integrated circuit, the method comprising:
 depositing a substantially oxygen- and carbon-free continuous ruthenium (Ru) metal film on a diffusion barrier layer in at least one recessed feature of the partially fabricated integrated circuit by thermal chemical vapor deposition (TCVD) using a process gas containing a $Ru_3(CO)_{12}$ precursor and carbon monoxide (CO) carrier gas, wherein the continuous Ru metal film has a thickness in a range from about 1nm to about 20nm;
 annealing the continuous Ru metal film in a non-oxidizing gas comprising an inert gas or hydrogen ($H_2$) gas, or a combination thereof, at a substrate temperature in a range from about 100° C. to about 500° C.;
 immersing the partially fabricated integrated circuit, or at least a portion thereof, in a first copper (Cu) plating bath to allow deposition of a continuous Cu metal layer on the continuous Ru metal film, wherein the continuous Ru metal film and the continuous Cu metal layer together fill the at least one recessed feature to a first width, depth and volume less than 100% of the width, depth and volume of the at least one recessed feature;
 removing the partially fabricated integrated circuit from the first Cu plating bath;
 annealing the continuous Cu metal layer in a non-oxidizing gas comprising an inert gas or $H_2$ gas, or a combination thereof, at a substrate temperature in a range from about 100° C. to about 500° C.;
 re-immersing the partially fabricated integrated circuit, or at least a portion thereof, in a second Cu plating bath to allow deposition of additional Cu metal that at least partially fills the at least one recessed feature to a second width, depth and volume greater than the first width, depth and volume and less than or equal to 100% of the width, depth and volume of the at least one recessed feature;
 removing the partially fabricated integrated circuit from the second Cu plating bath; and
 annealing the additional Cu metal in a non-oxidizing gas comprising an inert gas or $H_2$ gas, or a combination thereof, at a substrate temperature in a range from about 100° C. to about 500° C., whereby large Cu metal grains are formed on the continuous Ru metal film from the annealed continuous Cu metal layer and the annealed additional Cu metal.

25. The method of claim 24, wherein the re-immersing only partially fills the at least one recessed feature to the second width, depth and volume that is less than 100% of the width, depth and volume of the at least one recessed feature, and wherein the method further comprises repeating the steps of re-immersing in the second Cu plating bath, removing from the second Cu plating bath, and annealing the additional Cu metal are repeated a desired number of times to further fill the at least one recessed feature to a third width, depth and volume of about 90% to 100% of the width, depth and volume of the at least one recessed feature.

26. The method of claim 24, wherein the re-immersing in the second Cu plating bath fills less than about 50% percent of the width, depth and volume of the at least one recessed feature with the additional Cu metal.

27. The method of claim 24, wherein the re-immersing in the second Cu plating bath fills greater than about 50% percent of the width, depth and volume of the at least one recessed feature with additional Cu metal.

28. The method of claim 24, wherein the first and second Cu plating baths have different chemical compositions whereby the additional Cu metal deposits at a faster rate than the continuous Cu metal layer.

29. The method of claim 24, wherein the diffusion barrier layer comprises tantalum (Ta), tantalum nitride (TaN), tantalum carbide (TaC), tantalum carbonitride (TaCN), titanium (Ti), titanium nitride (TiN), titanium carbide (TiC), titanium carbonitride (TiCN), tungsten (W), tungsten nitride (WN), tungsten carbide (WC), or tungsten carbonitride (WCN), or a combination thereof.

30. The method of claim 24, wherein the re-immersing further allows deposition above the at least one recessed feature to thereby overfill the at least one recessed feature.

* * * * *